United States Patent
Yang

(10) Patent No.: US 10,839,114 B2
(45) Date of Patent: Nov. 17, 2020

(54) METHOD AND SYSTEM FOR STABLE AND EFFICIENT RESERVOIR SIMULATION USING STABILITY PROXIES

(71) Applicant: Yahan Yang, Pearland, TX (US)

(72) Inventor: Yahan Yang, Pearland, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 446 days.

(21) Appl. No.: 15/827,789

(22) Filed: Nov. 30, 2017

(65) Prior Publication Data

US 2018/0181693 A1    Jun. 28, 2018

Related U.S. Application Data

(60) Provisional application No. 62/438,619, filed on Dec. 23, 2016.

(51) Int. Cl.
*G06F 30/20* (2020.01)
*E21B 41/00* (2006.01)
*G01V 1/28* (2006.01)

(52) U.S. Cl.
CPC .............. *G06F 30/20* (2020.01); *E21B 41/00* (2013.01); *E21B 41/0092* (2013.01); *G01V 1/282* (2013.01); *G01V 2210/66* (2013.01)

(58) Field of Classification Search
CPC ...... G06F 30/20; E21B 41/00; E21B 41/0092; G01V 1/282; G01V 2210/66
See application file for complete search history.

(56) References Cited

U.S. PATENT DOCUMENTS

| | | | |
|---|---|---|---|
| 5,537,320 A | 7/1996 | Simpson et al. |
| 5,671,136 A | 9/1997 | Willhoit, Jr. |
| 5,706,194 A | 1/1998 | Neff et al. |
| 5,710,726 A | 1/1998 | Rowney et al. |
| 5,747,673 A | 5/1998 | Ungerer et al. |
| 5,838,634 A | 11/1998 | Jones et al. |
| 5,844,799 A | 12/1998 | Joseph et al. |
| 5,953,680 A | 9/1999 | Divies et al. |
| 5,992,519 A | 11/1999 | Ramakrishnan et al. |

(Continued)

FOREIGN PATENT DOCUMENTS

| | | |
|---|---|---|
| WO | 1999/028767 | 6/1999 |
| WO | 2007/022289 | 2/2007 |

(Continued)

OTHER PUBLICATIONS

Yang, Yahan, Jeffrey Edward Davidson, David James Fenter, Ozgur Ozen, and Barbara A. Boyett. "Reservoir development modeling using full physics and proxy simulations." In International Petroleum Technology Conference. International Petroleum Technology Conference, 2009. (Year: 2009).*

(Continued)

*Primary Examiner* — Rehana Perveen
*Assistant Examiner* — Chuen-Meei Gan
(74) *Attorney, Agent, or Firm* — ExxonMobil Upstream Research Company-Law Department

(57) ABSTRACT

A method and system are described to form a subsurface model for use in hydrocarbon operations. The method and system utilize stability proxies with the subsurface models, such as simulation models, and to manage the reservoir simulation.

28 Claims, 4 Drawing Sheets

(56) References Cited

U.S. PATENT DOCUMENTS

| | | |
|---|---|---|
| 6,014,343 A | 1/2000 | Graf et al. |
| 6,018,498 A | 1/2000 | Neff et al. |
| 6,052,529 A | 4/2000 | Watts, III |
| 6,106,561 A | 8/2000 | Farmer |
| 6,128,577 A | 10/2000 | Assa et al. |
| 6,128,579 A | 10/2000 | McCormack et al. |
| 6,138,076 A | 10/2000 | Graf et al. |
| 6,230,101 B1 | 5/2001 | Wallis |
| 6,370,491 B1 | 4/2002 | Malthe-Sorenssen et al. |
| 6,374,185 B1 | 4/2002 | Taner et al. |
| 6,480,790 B1 | 11/2002 | Calvert et al. |
| 6,549,854 B1 | 4/2003 | Malinverno et al. |
| 6,597,995 B1 | 7/2003 | Cornu et al. |
| 6,662,146 B1 | 12/2003 | Watts |
| 6,664,961 B2 | 12/2003 | Ray et al. |
| 6,823,296 B2 | 11/2004 | Rey-Fabret et al. |
| 6,823,297 B2 | 11/2004 | Jenny et al. |
| 6,826,483 B1 | 11/2004 | Anderson et al. |
| 6,826,520 B1 | 11/2004 | Khan et al. |
| 6,826,521 B1 | 11/2004 | Hess et al. |
| 6,839,632 B2 | 1/2005 | Grace |
| 6,901,391 B2 | 5/2005 | Storm, Jr. et al. |
| 6,940,507 B2 | 9/2005 | Repin et al. |
| 6,980,940 B1 | 12/2005 | Gurpinar et al. |
| 6,987,878 B2 | 1/2006 | Lees et al. |
| 7,031,891 B2 | 4/2006 | Malthe-Sorenssen et al. |
| 7,043,367 B2 | 5/2006 | Granjeon |
| 7,043,410 B2 | 5/2006 | Malthe-Sorenssen et al. |
| 7,047,165 B2 | 5/2006 | Balaven et al. |
| 7,069,149 B2 | 6/2006 | Goff et al. |
| 7,089,166 B2 | 8/2006 | Malthe-Sorenssen et al. |
| 7,096,122 B2 | 8/2006 | Han |
| 7,096,172 B2 | 8/2006 | Colvin et al. |
| 7,177,787 B2 | 2/2007 | Rey-Fabret et al. |
| 7,191,071 B2 | 3/2007 | Kfoury et al. |
| 7,254,091 B1 | 8/2007 | Gunning et al. |
| 7,277,796 B2 | 10/2007 | Kuchuk et al. |
| 7,280,952 B2 | 10/2007 | Butler et al. |
| 7,286,972 B2 | 10/2007 | Maker |
| 7,363,163 B2 | 4/2008 | Valec-Dupin et al. |
| 7,369,980 B2 | 5/2008 | Deffenbaugh et al. |
| 7,376,539 B2 | 5/2008 | Lecomte |
| 7,379,853 B2 | 5/2008 | Middya |
| 7,379,854 B2 | 5/2008 | Calvert et al. |
| 7,406,878 B2 | 8/2008 | Rieder et al. |
| 7,412,363 B2 | 8/2008 | Callegari |
| 7,415,401 B2 | 8/2008 | Calvert et al. |
| 7,424,415 B2 | 9/2008 | Vassilev |
| 7,433,786 B2 | 10/2008 | Adams |
| 7,451,066 B2 | 11/2008 | Edwards et al. |
| 7,467,044 B2 | 12/2008 | Tran et al. |
| 7,478,024 B2 | 1/2009 | Gurpinar et al. |
| 7,480,205 B2 | 1/2009 | Wei |
| 7,486,589 B2 | 2/2009 | Lee et al. |
| 7,516,056 B2 | 4/2009 | Wallis et al. |
| 7,523,024 B2 | 4/2009 | Endres et al. |
| 7,526,418 B2 | 4/2009 | Pita et al. |
| 7,539,625 B2 | 5/2009 | Klumpen et al. |
| 7,542,037 B2 | 6/2009 | Fremming |
| 7,546,229 B2 | 6/2009 | Jenny et al. |
| 7,548,840 B2 | 6/2009 | Saaf |
| 7,577,527 B2 | 8/2009 | Velasquez |
| 7,584,081 B2 | 9/2009 | Wen et al. |
| 7,596,056 B2 | 9/2009 | Keskes et al. |
| 7,596,480 B2 | 9/2009 | Fung et al. |
| 7,596,481 B2 | 9/2009 | Zamora et al. |
| 7,603,265 B2 | 10/2009 | Mainguy et al. |
| 7,606,691 B2 | 10/2009 | Calvert et al. |
| 7,617,082 B2 | 11/2009 | Childs et al. |
| 7,620,800 B2 | 11/2009 | Huppenthal et al. |
| 7,640,149 B2 | 12/2009 | Rowan et al. |
| 7,657,494 B2 | 2/2010 | Wilkinson et al. |
| 7,672,825 B2 | 3/2010 | Brouwer et al. |
| 7,684,929 B2 | 3/2010 | Prange et al. |
| 7,706,981 B2 | 4/2010 | Wilkinson et al. |
| 7,711,532 B2 | 5/2010 | Dulac et al. |
| 7,716,029 B2 | 5/2010 | Couet et al. |
| 7,771,532 B2 | 5/2010 | Dulac et al. |
| 7,739,089 B2 | 6/2010 | Gurpinar et al. |
| 7,742,875 B2 | 6/2010 | Li et al. |
| 7,752,023 B2 | 7/2010 | Middya |
| 7,756,694 B2 | 7/2010 | Graf et al. |
| 7,783,462 B2 | 8/2010 | Landis, Jr. et al. |
| 7,796,469 B2 | 9/2010 | Keskes et al. |
| 7,809,537 B2 | 10/2010 | Hemanthkumar et al. |
| 7,809,538 B2 | 10/2010 | Thomas |
| 7,822,554 B2 | 10/2010 | Zuo et al. |
| 7,844,430 B2 | 11/2010 | Landis, Jr. et al. |
| 7,860,654 B2 | 12/2010 | Stone |
| 7,869,954 B2 | 1/2011 | Den Boer et al. |
| 7,877,246 B2 | 1/2011 | Moncorge et al. |
| 7,878,268 B2 | 2/2011 | Chapman et al. |
| 7,904,248 B2 | 3/2011 | Lie et al. |
| 7,920,970 B2 | 4/2011 | Zuo et al. |
| 7,925,481 B2 | 4/2011 | Van Wagoner et al. |
| 7,932,904 B2 | 4/2011 | Branets et al. |
| 7,933,750 B2 | 4/2011 | Morton et al. |
| 7,953,585 B2 | 5/2011 | Gurpinar et al. |
| 7,970,593 B2 | 6/2011 | Roggero et al. |
| 7,986,319 B2 | 7/2011 | Dommisse |
| 7,991,660 B2 | 8/2011 | Callegari |
| 7,996,154 B2 | 8/2011 | Zuo et al. |
| 8,005,658 B2 | 8/2011 | Tilke et al. |
| 8,050,892 B2 | 11/2011 | Hartman |
| 8,078,437 B2 | 12/2011 | Wu et al. |
| 8,095,345 B2 | 1/2012 | Hoversten |
| 8,095,349 B2 | 1/2012 | Kelkar et al. |
| 8,145,464 B2 | 3/2012 | Arengaard et al. |
| 8,150,663 B2 | 4/2012 | Mallet |
| 8,190,405 B2 | 5/2012 | Appleyard |
| 8,204,726 B2 | 6/2012 | Lee et al. |
| 8,204,727 B2 | 6/2012 | Dean et al. |
| 8,209,202 B2 | 6/2012 | Narayanan et al. |
| 8,212,814 B2 | 7/2012 | Branets et al. |
| 8,234,073 B2 | 7/2012 | Pyrcz et al. |
| 8,255,195 B2 | 8/2012 | Yogeswaren |
| 8,315,845 B2 | 11/2012 | Lepage |
| 8,355,898 B2 | 1/2013 | Pyrcz et al. |
| 8,374,836 B2 | 2/2013 | Yogeswaren |
| 8,396,699 B2 | 3/2013 | Maliassov |
| 8,447,522 B2 | 5/2013 | Brooks |
| 8,447,525 B2 | 5/2013 | Pepper et al. |
| 8,452,580 B2 | 5/2013 | Strebelle |
| 8,457,940 B2 | 6/2013 | Xi et al. |
| 8,463,586 B2 | 6/2013 | Mezghani et al. |
| 8,494,828 B2 | 7/2013 | Wu et al. |
| 8,515,678 B2 | 8/2013 | Pepper et al. |
| 8,515,720 B2 | 8/2013 | Koutsabeloulis et al. |
| 8,577,660 B2 | 11/2013 | Wendt et al. |
| 8,594,986 B2 | 11/2013 | Lunati |
| 8,599,643 B2 | 12/2013 | Pepper et al. |
| 8,606,555 B2 | 12/2013 | Pyrcz et al. |
| 8,639,444 B2 | 1/2014 | Pepper et al. |
| 8,655,632 B2 | 2/2014 | Moguchaya |
| 8,674,984 B2 | 3/2014 | Ran et al. |
| 8,694,261 B1 | 4/2014 | Robinson |
| 8,700,370 B2 | 4/2014 | Landa |
| 8,731,887 B2 | 5/2014 | Hilliard et al. |
| 8,775,142 B2 | 7/2014 | Liu et al. |
| 8,798,974 B1 | 8/2014 | Nunns |
| 8,818,778 B2 | 8/2014 | Salazar-Tio et al. |
| 8,843,353 B2 | 9/2014 | Posamentier et al. |
| 8,922,558 B2 | 12/2014 | Page et al. |
| 8,935,141 B2 | 1/2015 | Ran et al. |
| 9,188,699 B2 | 11/2015 | Carruthers et al. |
| 9,416,656 B2 | 8/2016 | Pomerantz et al. |
| 2002/0049575 A1 | 4/2002 | Jalali et al. |
| 2005/0171700 A1 | 8/2005 | Dean |
| 2005/0209836 A1* | 9/2005 | Klumpen ......... G05B 19/41885 703/10 |
| 2006/0122780 A1 | 6/2006 | Cohen et al. |
| 2006/0269139 A1 | 11/2006 | Keskes et al. |
| 2007/0016389 A1 | 1/2007 | Ozgen |

(56) References Cited

U.S. PATENT DOCUMENTS

| | | | |
|---|---|---|---|
| 2007/0179768 A1* | 8/2007 | Cullick | E21B 43/00 703/10 |
| 2007/0277115 A1 | 11/2007 | Glinsky et al. | |
| 2007/0279429 A1 | 12/2007 | Ganzer et al. | |
| 2008/0126168 A1 | 5/2008 | Carney et al. | |
| 2008/0133550 A1 | 6/2008 | Orangi et al. | |
| 2008/0144903 A1 | 6/2008 | Wang et al. | |
| 2008/0234988 A1 | 9/2008 | Chen et al. | |
| 2008/0306803 A1 | 12/2008 | Vaal et al. | |
| 2009/0055141 A1* | 2/2009 | Moncorge | E21B 43/00 703/2 |
| 2009/0071239 A1 | 3/2009 | Rojas et al. | |
| 2009/0122061 A1 | 5/2009 | Hammon, III | |
| 2009/0248373 A1 | 10/2009 | Druskin et al. | |
| 2010/0121623 A1* | 5/2010 | Yogeswaren | G01V 11/00 703/2 |
| 2010/0132450 A1 | 6/2010 | Pomerantz et al. | |
| 2010/0138196 A1 | 6/2010 | Hui et al. | |
| 2010/0161300 A1 | 6/2010 | Yeten et al. | |
| 2010/0179797 A1 | 7/2010 | Cullick et al. | |
| 2010/0185428 A1 | 7/2010 | Vink | |
| 2010/0191516 A1 | 7/2010 | Benish et al. | |
| 2010/0312535 A1 | 12/2010 | Chen et al. | |
| 2010/0324873 A1 | 12/2010 | Cameron | |
| 2011/0004447 A1 | 1/2011 | Hurley et al. | |
| 2011/0054869 A1 | 3/2011 | Li et al. | |
| 2011/0115787 A1 | 5/2011 | Kadlec | |
| 2011/0161133 A1 | 6/2011 | Staveley et al. | |
| 2011/0310101 A1 | 12/2011 | Prange et al. | |
| 2012/0059640 A1 | 3/2012 | Roy et al. | |
| 2012/0065951 A1 | 3/2012 | Roy et al. | |
| 2012/0143577 A1 | 6/2012 | Szyndel et al. | |
| 2012/0158389 A1 | 6/2012 | Wu et al. | |
| 2012/0159124 A1 | 6/2012 | Hu et al. | |
| 2012/0215512 A1 | 8/2012 | Sarma | |
| 2012/0215513 A1 | 8/2012 | Branets et al. | |
| 2012/0232799 A1 | 9/2012 | Zuo et al. | |
| 2012/0232859 A1 | 9/2012 | Pomerantz et al. | |
| 2012/0232861 A1 | 9/2012 | Lu et al. | |
| 2012/0232865 A1 | 9/2012 | Maucec et al. | |
| 2012/0265512 A1 | 10/2012 | Hu et al. | |
| 2012/0271609 A1 | 10/2012 | Laake et al. | |
| 2012/0296617 A1 | 11/2012 | Zuo et al. | |
| 2013/0030782 A1 | 1/2013 | Yogeswaren | |
| 2013/0035913 A1 | 2/2013 | Mishev et al. | |
| 2013/0041633 A1 | 2/2013 | Hoteit | |
| 2013/0046524 A1 | 2/2013 | Gathogo et al. | |
| 2013/0073268 A1 | 3/2013 | Abacioglu et al. | |
| 2013/0080128 A1* | 3/2013 | Yang | G01V 11/00 703/2 |
| 2013/0085730 A1 | 4/2013 | Shaw et al. | |
| 2013/0090907 A1 | 4/2013 | Maliassov | |
| 2013/0096890 A1 | 4/2013 | Vanderheyden et al. | |
| 2013/0096898 A1 | 4/2013 | Usadi et al. | |
| 2013/0096899 A1 | 4/2013 | Usadi et al. | |
| 2013/0096900 A1 | 4/2013 | Usadi et al. | |
| 2013/0110484 A1 | 5/2013 | Hu et al. | |
| 2013/0112406 A1 | 5/2013 | Zuo et al. | |
| 2013/0116993 A1 | 5/2013 | Maliassov | |
| 2013/0118736 A1 | 5/2013 | Usadi et al. | |
| 2013/0124097 A1 | 5/2013 | Thorne | |
| 2013/0124161 A1 | 5/2013 | Poudret et al. | |
| 2013/0124173 A1* | 5/2013 | Lu | G06F 30/20 703/2 |
| 2013/0138412 A1 | 5/2013 | Shi et al. | |
| 2013/0151159 A1 | 6/2013 | Pomerantz et al. | |
| 2013/0166264 A1 | 6/2013 | Usadi et al. | |
| 2013/0179080 A1 | 7/2013 | Skalinski et al. | |
| 2013/0185033 A1 | 7/2013 | Tompkins et al. | |
| 2013/0204922 A1 | 8/2013 | El-Bakry et al. | |
| 2013/0218539 A1 | 8/2013 | Souche | |
| 2013/0231907 A1 | 9/2013 | Yang et al. | |
| 2013/0231910 A1 | 9/2013 | Kumar et al. | |
| 2013/0245949 A1 | 9/2013 | Abitrabi et al. | |
| 2013/0246031 A1 | 9/2013 | Wu et al. | |
| 2013/0289961 A1 | 10/2013 | Ray et al. | |
| 2013/0289962 A1 | 10/2013 | Wendt et al. | |
| 2013/0304679 A1 | 11/2013 | Fleming et al. | |
| 2013/0311151 A1 | 11/2013 | Plessix | |
| 2013/0312481 A1 | 11/2013 | Pelletier et al. | |
| 2013/0332125 A1 | 12/2013 | Suter et al. | |
| 2013/0338985 A1 | 12/2013 | Garcia et al. | |
| 2014/0012557 A1 | 1/2014 | Tarman et al. | |
| 2014/0136158 A1 | 5/2014 | Hegazy et al. | |
| 2014/0136171 A1 | 5/2014 | Sword, Jr. et al. | |
| 2014/0166280 A1 | 6/2014 | Stone et al. | |
| 2014/0201450 A1* | 7/2014 | Haugen | G06F 7/60 711/125 |
| 2014/0214388 A1 | 7/2014 | Gorell | |
| 2014/0222342 A1 | 8/2014 | Robinson | |
| 2014/0236558 A1 | 8/2014 | Maliassov | |
| 2014/0278298 A1 | 9/2014 | Maerten | |
| 2015/0073763 A1 | 3/2015 | Wang et al. | |
| 2015/0120199 A1 | 4/2015 | Casey | |
| 2015/0134314 A1 | 5/2015 | Lu et al. | |
| 2015/0293260 A1 | 10/2015 | Ghayour et al. | |
| 2016/0011328 A1 | 1/2016 | Jones et al. | |
| 2016/0035130 A1 | 2/2016 | Branets et al. | |
| 2016/0041279 A1 | 2/2016 | Casey | |
| 2016/0070012 A1 | 3/2016 | Rutten | |
| 2016/0124113 A1 | 5/2016 | Bi et al. | |
| 2016/0125555 A1 | 5/2016 | Branets et al. | |

FOREIGN PATENT DOCUMENTS

| | | |
|---|---|---|
| WO | 2007/116008 | 10/2007 |
| WO | 2009/138290 | 11/2009 |
| WO | 2014/027196 | 2/2014 |

OTHER PUBLICATIONS

Arbogast, Todd. "Numerical subgrid upscaling of two-phase flow in porous media." In Numerical treatment of multiphase flows in porous media, pp. 35-49. Springer, Berlin, Heidelberg, 2000. (Year: 2000).*

Aarnes, J. (2004), "Multiscale simulation of flow in heterogeneous oil-reservoirs", SINTEF ICT, Dept. of Applied Mathematics, 2 pgs.

Aarnes, J. et al. (2004), "Toward reservoir simulation on geological grid models", 9$^{th}$ European Conf. on the Mathematics of Oil Recovery, 8 pgs.

Aarnes, I.E. et al. (2006), "An Adaptive Multiscale Method for Simulation of Fluid Flow in Heterogeneous Porous Media", *Multiscale Model Simulation*, vol. 5, No. 3, pp. 918-939.

Ahmadizadeh, M., et al., (2007), "Combined Implicit or Explicit Integration Steps for Hybrid Simulation", *Structural Engineering Research Frontiers*, pp. 1-16.

Arbogast T. (2000) "Numerical Subgrid Upscaling of Two-Phase Flow in Porous Media" In: Chen Z., Ewing R.E., Shi ZC. (eds) *Numerical Treatment of Multiphase Flows in Porous Media. Lecture Notes in Physics*, vol. 552. Springer, Berlin, Heidelberg; pp. 35-49.

Ates, H., et al. (2009), "Dynamic Upsating of Reservoir Model", *Society of Petroleum Engineer 123671-MS*, SPE Annual Technical Conference and Exhibition, Oct. 4-7, New Orleans, Louisiana; pp. 1-9.

Bortoli, L. J., et al., (1992), "Constraining Stochastic Images to Seismic Data", Geostatistics, Troia, *Quantitative Geology and Geostatistics 1*, 325-338.

Branets, L.V. et al. (2008) "Challenges and Technologies in Reservoir Modeling" *Communications in Computational Physics*, vol. 6, No. 1, pp. 1-23.

Byer, T.J., et al., (1998), "Preconditioned Newton Methods for Fully Coupled Reservoir and Surface Facility Models", SPE 49001, *1998 SPE Annual Tech. Conf., and Exh.*, pp. 181-188.

Candes, E. J., et al., (2004), "New Tight Frames of Curvelets and Optimal Representations of Objects with $C^2$ Singularities," *Communications on Pure and Applied Mathematics 57*, 219-266.

(56) References Cited

OTHER PUBLICATIONS

Chen, Y. et al. (2003), "A coupled local-global upscaling approach for simulating flow in highly heterogeneous formations", *Advances in Water Resources 26*, pp. 1041-1060.
Connolly, P., (1999), "Elastic Impedance," *The Leading Edge 18*, 438-452.
Crotti, M.A. (2003), "Upscaling of Relative Permeability Curves for Reservoir Simulation: An Extension to Areal Simulations Based on Realistic Average Water Saturations", SPE 81038, SPE Latin American and Caribbean Petroleum Engineering Conf., 6 pgs.
Cullick, A.S., et al. (2006), "Improved and More-Rapid History Matching With a Nonlinear Proxy and Global Optimization", *Society of Petroleum Engineer 101933-MS*, SPE Annual Technical Conference and Exhibition, Sep. 24-27, San Antonio, Texas, pp. 1-13.
Donoho, D. L., Hou, X., (2002), "Beamlets and Multiscale Image Analysis," *Multiscale and Multiresolution Methods, Lecture Notes in Computational Science and Engineering 20*, 149-196.
Durlofsky, L.J. (1991), "Numerical Calculation of Equivalent Grid Block Permeability Tensors for Heterogeneous Porous Media", *Water Resources Research 27(5)*, pp. 699-708.
Efendiev, Y., et al. (2007) "Coarsening of three-dimensional structured and unstructured grids for subsurface flow", *Advances in Water Resources*, vol. 30, Issue 11, pp. 2177-2193.
Farmer, C.L. (2002), "Upscaling: a review", *Int'l Journal for Numerical Methods in Fluids 40*, pp. 63-78.
Gai, X., et al., (2005), "A Timestepping Scheme for Coupled Reservoir Flow and Geomechanics in Nonmatching Grids", SPE 97054, *2005 SPE Annual Tech. Conf and Exh.*, pp. 1-11.
Gunasekera, D, et al. (1997), "The Generation and Application of K-Orthogonal Grid Systems", *Society of Petroleum Engineer 37998-MS*, SPE Reservoir Simulation Symposium, Jun. 8-11, Dallas, Texas, pp. 199-214.
Haas, A., et al., (1994), "Geostatistical Inversion—A Sequential Method of Stochastic Reservoir Modeling Constrained by Seismic Data," *First Break 12*, 561-569 (1994).
Haugen, K. B., et al., (2013), "Highly Optimized Phase Equilibrium Calculations", SPE 163583,pp. 1-9.
Heinemann, Z.E., et al. (1998) "modeling Heavily Faulted Reservoirs", *Society of Petroleum Engineer 48998-MS*, SPE Annual Technical Conference and Exhibition, Sep. 27-30, New Orleans, Louisiana, pp. 1-11.
Holden, L. et al. (1992), "A Tensor Estimator for the Homogenization of Absolute Permeability", *Transport in Porous Media 8*, pp. 37-46.
Isaaks, E. H., et al., (1989), "Applied Geostatistics", *Oxford University Press*, New York, pp. 40-65.
Johnson, V. M., et al. (2001), "Applying soft computing methods to improve the computational tractability of a subsurface simulation-optimization problem", *Journal of Petroleum Science and Engineering*, vol. 29, pp. 153-175.
Journel, A., (1992), "Geostatistics: Roadblocks and Challenges," *Geostatistics, Troia '92: Quanititative Geoglogy and Geostatistics 1*, 213-224.
Klie, H., et al., (2005), "Krylov-Secant Methods for Accelerating the Solution of Fully Implicit Formulations", SPE 92863, *2005 SPE Reservoir Simulation Symposium*, 9 pgs.
Kurzak, J., et al., (2007), "Implementation of Mixed Precision in Solving Systems of Linear Equations on the Cell Processor", *Concurrency Computat.: Pract. Exper. 2007*, vol. 19, pp. 1371-1385.
Kuwauchi, Y., et al. (1996), "Development and Applications of a Three Dimensional Voronoi-Based Flexible Grid Black Oil Reservoir Simulator", *Society of Petroleum Engineer 37028-MS*, SPE Asia Pacific Oil and Gas Conference, Oct. 28-31, Adelaide, Australia, pp. 1-12.
Lu, B., et al., (2007), "Iteratively Coupled Reservoir Simulation for Multiphase Flow", SPE 110114, *2007 SPE Annual Tech. Conf. and Exh.*, pp. 1-9.

Mallat, S., (1999), "A Wavelet Tour of Signal Processing", *Academic Press*, San Diego, pp. 80-91.
Mosqueda, G., et al., (2007), "Combined Implicit or Explicit Integration Steps for Hybrid Simulation", *Earthquake Engng. & Struct. Dyn.*, vol. 36(15), pp. 2325-2343.
Nybo, R. (2010), "Fault detection and other time series opportunities in the petroleum industry", *Neurocomputing*, vol. 73, pp. 1987-1992.
Prevost, M., (2003), "Accurate coarse reservoir modeling using unstructured grids, flow-based upscaling and streamline simulation" *Dissertation*, Submitted to the Department of Petroleum Enginnering and the Committee on Graduate Studies of Stanford University; pp. 248 pages.
Qi, D. et al. (2001), "An Improved Global Upscaling Approach for Reservoir Simulation", *Petroleum Science and Technology 19(7 &8)*, pp. 779-795.
Strebelle, S., (2002), "Conditional simulations of complex geological structures using multiple-point statistics," *Mathematical Geology 34(1)*, 1-21.
Sweldens, W., (1998), "The Lifting Scheme: A Construction of Second Generation Wavelets," *SIAM Journal on Mathematical Analysis 29*, 511-546.
Verly, G., (1991), "Sequential Gaussian Simulation: A Monte Carlo Approach for Generating Models of Porosity and Permeability," Special Publication No. 3 of EAPG—Florence 1991 Conference, Ed.: Spencer, A.M.
Whitcombe, D. N., et al., (2002), "Extended elastic impedance for fluid and lithology prediction," *Geophysics 67*, 63-67.
White, C.D. et al. (1987), "Computing Absolute Transmissibility in the Presence of Fine-Scale Heterogeneity", SPE 16011, $9^{th}$ SPE Symposium in Reservoir Simulation, pp. 209-220.
Wu, J. et al. (2007) "Non-stationary Multiple-point Geostatistical Simulations with Region Concept" Proceedings of the $20^{th}$ SCRF Meeting, Stanford, CA USA. 53 pages.
Wu, X.H. et al. (2007), "Reservoir Modeling with Global Scaleup", SPE 105237, $15^{th}$ SPE Middle East Oil & Gas Show & Conf., 13 pgs.
Yao, T., et al., (2004), "Spectral Component Geologic Modeling: A New Technology for Integrating Seismic Information at the Correct Scale," Geostatistics Banff, *Quantitative Geology & Geostatistics 14*, pp. 23-33.
Yeten, B., et al. (2005), "A Comparison Study on Experimental Design and Response Surface Methodologies", *Society of Petroleum Engineer 93347-MS*, SPE Reservoir Simulation Symposium, Jan. 31-Feb. 2, The Woodlands, Texas, pp. 1-15.
Younis, R.M., et al., (2009), "Adaptively-Localized-Continuation-Newton: Reservoir Simulation Nonlinear Solvers That Converge All the Time", SPE 119147, *2009 SPE Reservoir Simulation Symposium*, pp. 1-21.mos.
Zhang T., et al., (2006), "Filter-based classification of training image patterns for spatial Simulation," *Mathematical Geology 38*, 63-80.
Midland Valley, 2D Kinematic Modelling (2015), brochure, retrieved from the internet on Sep. 28, 2015, from Midland Valley website (www.mve.com), 2 pages.
Midland Valley, 3D Kinematic Modelling (2015), brochure, retrieved from the internet on Sep. 28, 2015, from Midland Valley website (www.mve.com), 2 pages.
Mohaghegh, S.D. et al. (2016) "Production Management Decision Analysis Using AI-Based Proxy Modeling of Reservoir Simulations—A Look-Back Case Study" Journal of Petroleum Exploration and Production Technology SPE-170664-MS, pp. 201-215.
Shamlou, S.S., et al. (2012) "Optimization of Petroleum Production Networks—Through Proxy Models and Structural Constraints", Proceedings of the $17^{th}$ World Congress the International Federation of Automatic Control, Seoul, Korea, vol. 45, No. 15, pp. 543-548.
Yang, Y., et al (2009) "Reservoir Development Modeling Using Full Physics and Proxy Simulations" International Petroleum Technology Conference 13536, held in Doha, Qatar, Dec. 7-9, pp. 1-13.

\* cited by examiner

METHOD AND SYSTEM FOR STABLE AND EFFICIENT RESERVOIR SIMULATION USING STABILITY PROXIES

CROSS-REFERENCE TO RELATED APPLICATION

This application claims the benefit of U.S. Provisional Patent Application 62/438,619 filed Dec. 23, 2016 entitled METHOD AND SYSTEM FOR STABLE AND EFFICIENT RESERVOIR SIMULATION USING STABILITY PROXIES, the entirety of which is incorporated by reference herein.

FIELD OF THE INVENTION

This disclosure relates generally to the field of hydrocarbon exploration, development and production and, more particularly, to subsurface modeling. Specifically, the disclosure relates to a method for using stability proxies in simulation models to provide stable and efficient reservoir simulations. The resulting enhancements may then be used for hydrocarbon operations, such as hydrocarbon exploration, hydrocarbon development and/or hydrocarbon production.

BACKGROUND

This section is intended to introduce various aspects of the art, which may be associated with exemplary embodiments of the present disclosure. This discussion is believed to assist in providing a framework to facilitate a better understanding of particular aspects of the present invention. Accordingly, it should be understood that this section should be read in this light, and not necessarily as admissions of prior art.

In exploration, development and/or production stages for resources, such as hydrocarbons, different types of subsurface models may be used to represent the subsurface structures, which may include a description of a subsurface structures and material properties for a subsurface region. For example, the subsurface model may be a geologic model or a reservoir model. The subsurface model may represent measured or interpreted data for the subsurface region, may be within a physical space or domain, and may include features (e.g., horizons, faults, surfaces, volumes, and the like). The subsurface model may also be discretized with a mesh or a grid that includes nodes and forms cells (e.g., voxels or elements) within the model. The geologic model may represent measured or interpreted data for the subsurface region, such as seismic data and well log data, and may have material properties, such as rock properties. The reservoir model may be used to simulate flow of fluids within the subsurface region. Accordingly, the reservoir model may use the same mesh and/or cells as other models, or may resample or upscale the mesh and/or cells to lessen the computations for simulating the fluid flow.

Reservoir modeling is utilized in the development and the production phases for hydrocarbon assets. The development phase involves determining capital requirements and operating expenses prior to large-scale production from a prospective hydrocarbon asset. During the development phase, one or more reservoir models are created and conditioned to seismic data, well logging data and well test data, and underlying geological and statistical concepts. The reservoir models are utilized to estimate locations and potential development plans to extract hydrocarbons. During the production phase, numerical reservoir simulation is used to optimize a depletion plan and maximize recovery of hydrocarbons.

To perform a reservoir simulation, the simulation models multiphase fluid flows in the reservoir, wells, and production facility network (e.g., production and/or injection facilities). Typically, a simulation is divided into a series of time steps, where different computational tasks, including well management, fluid property calculation, flow evaluation, matrix assembly, and solution of linear system, are performed. Depending on the size of the reservoir (e.g., the number of mesh elements in the reservoir model) and availability of computational resources, a simulation may be performed in serial mode using a single processor or in parallel using multiple compute nodes.

However, the use of certain reservoir simulation models may be problematic. One problem involves the estimation of well bottom-hole pressure, which may be not reliable. For example, the bottom-hole pressure may be based on a guess or rule of thumb. Another problem may be that the reservoir model has convergence problems because the reservoir model may rely upon simplified stability approaches. For example, a simple stability analysis may be used for simple hydraulic wells. Further, the stability analysis of coupled flow networks may not be present. Yet another problem may be that the computation for the reservoir simulation are not capable of being extended to parallel simulator architectures, which increases the computational time of any associated simulation.

Accordingly, there remains a need in the industry for methods and systems that are more efficient and may lessen problems associated with forming a subsurface model for use in hydrocarbon operations. Further, a need remains for an enhanced method to provide stability in subsurface models, such as simulation models, and to provide efficient reservoir simulation. The present techniques provide a method and apparatus that overcome one or more of the deficiencies discussed above.

SUMMARY

In one embodiment, a method for creating and using stability proxies for hydrocarbon operations in a subsurface region is described. The method comprising: obtaining a simulation model associated with a portion of a reservoir, one or more wells and production facilities, the simulation model includes a plurality of objects, wherein each of the plurality of objects represents a portion of a well or a production facility network and the plurality of objects include one or more of a node object, a connection object and any combination thereof, creating a stability proxy for each of the plurality of objects to form stability proxies; determining initialization parameters for the well and production facility network based on the created stability proxies; performing a reservoir simulation based on the initialization parameters; and outputting the simulation results, wherein the simulation results comprise one or more of pressure, injection flow rate, production flow rate and any combination thereof.

In another embodiment, a system for creating and using stability proxies for hydrocarbon operations in a subsurface region comprising: a processor; an input device in communication with the processor and memory in communication with the processor. The processor is configured to receive input data associated with a subsurface region. The memory has a set of instructions, wherein the set of instructions, when executed by the processor, are configured to: obtain a simulation model associated with a portion of a reservoir, one or more wells and production facilities, the simulation model includes a plurality of objects, wherein each of the plurality of objects represents a portion of a well or a production facility network and the plurality of objects include one or more of a node object, a connection object and any combination thereof; create a stability proxy for each of the plurality of objects to form stability proxies; determine initialization parameters for the well and production facility network based on the created stability proxies; perform a reservoir simulation based on the initialization parameters; and output the simulation results, wherein the simulation results comprise one or more of pressure, injection flow rate, production flow rate and any combination thereof.

In one or more embodiments, the system may include various enhancements. For example, the system may include wherein each of the stability proxies comprise a set of equations; wherein the stability proxy is a discrete dataset and is constructed separately for each of the plurality of objects; wherein the stability proxy is a one-dimensional (1D) table with one or more columns associated with values for fluid flow within the respective objects; wherein the one or more columns comprise one or more of pressure, mass rate of flow, and phase rate of flow; and/or wherein the one or more columns comprise a range of values from a minimum value to a maximum value. Further, the set of instructions, when executed by the processor, may be further configured to: determine whether each of the stability proxies provides sufficient resolution; and add data to the table when the resolution is not sufficient; calculate only first order derivatives to create the each stability proxy; create a first stability proxy for a first object closest to the reservoir and then create additional stability proxies for each of the plurality of objects by traversing downstream from the first object; provide the stability proxies to a well management module to optimize production; validate boundary conditions based on the stability proxies associated with a boundary object of the plurality of objects; perform a look-up to set the initial values for the boundary object; determine initial values for each of the plurality of objects upstream of the boundary object; determine initial values for each object of the plurality of objects from the boundary object by traversing upstream from each connected object to the subsequent object until a base object is reached; and/or modify one of the plurality of objects; and based on the modified one of the plurality of objects, adjust the stability proxies downstream of the modified one of the plurality of objects and continuing to use the stability proxies for each of the plurality of objects upstream of the modified one of the plurality of objects.

BRIEF DESCRIPTION OF THE DRAWINGS

The advantages of the present invention are better understood by referring to the following detailed description and the attached drawings.

DETAILED DESCRIPTION

Figure 1:
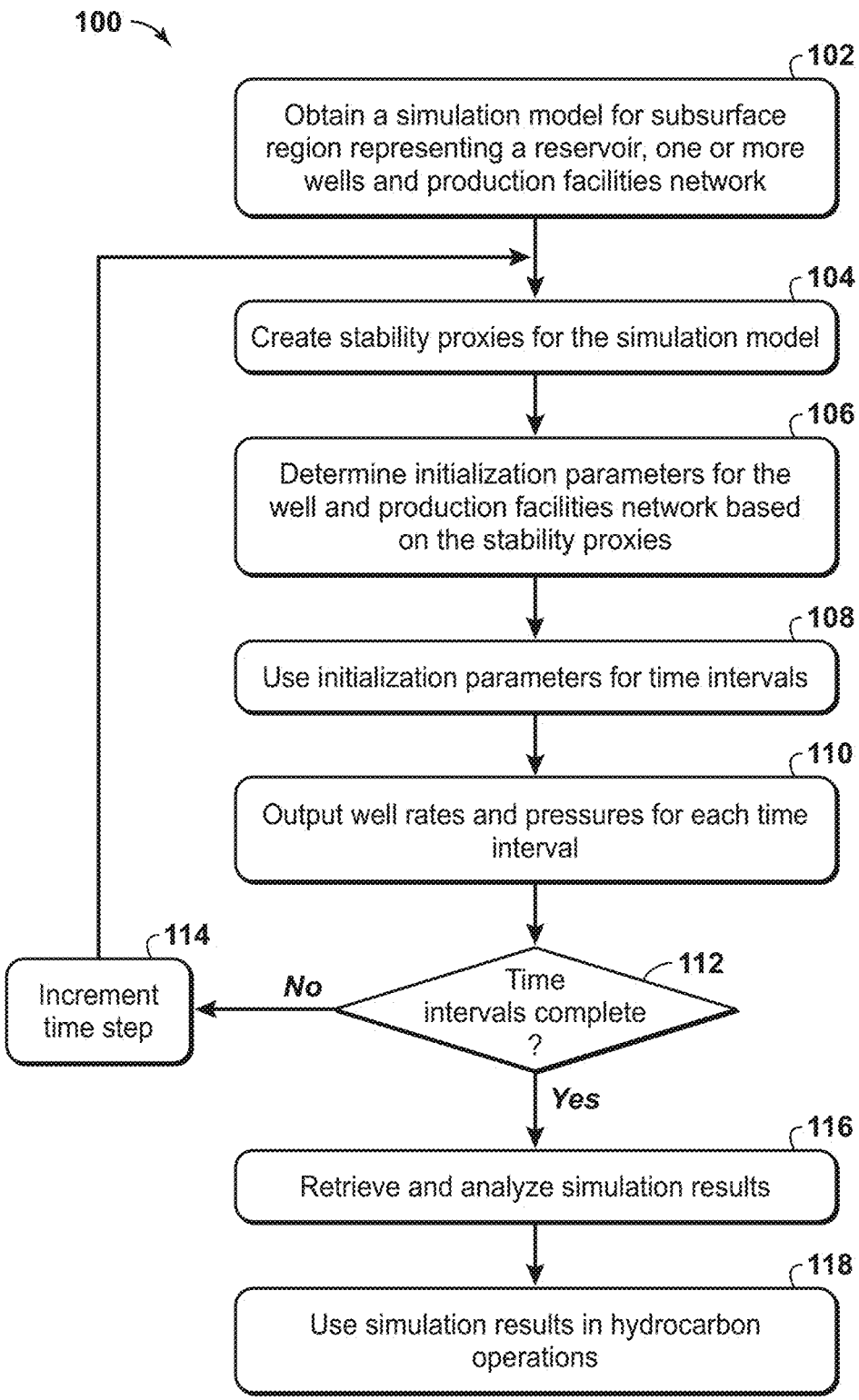
FIG. 1 is an exemplary flow chart in accordance with an embodiment of the present techniques.

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent.

The articles "the", "a" and "an" are not necessarily limited to mean only one, but rather are inclusive and open ended so as to include, optionally, multiple such elements.

As used herein, the term "hydrocarbons" are generally defined as molecules formed primarily of carbon and hydrogen atoms such as oil and natural gas. Hydrocarbons may also include other elements or compounds, such as, but not limited to, halogens, metallic elements, nitrogen, oxygen, sulfur, hydrogen sulfide ($H_2S$) and carbon dioxide ($CO_2$). Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof. Hydrocarbons may be located within or adjacent to mineral matrices within the earth, termed reservoirs. Matrices may include, but are not limited to, sedimentary rock, sands, silicilytes, carbonates, diatomites, and other porous media.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models and determining the likely locations for hydrocarbon reservoirs within the subsurface. The measurement data may include seismic data, gravity data, magnetic data, electromagnetic data and the like.

As used herein, "hydrocarbon development" refers to any activity associated with planning of extraction and/or access to hydrocarbons in subsurface regions. Hydrocarbon development normally refers to any activity conducted to plan for access to and/or for production of hydrocarbons from the subsurface formation and the associated modeling of the data to identify preferred development approaches and methods. By way of example, hydrocarbon development may include modeling of the subsurface formation and extraction planning for periods of production; determining and planning equipment to be utilized and techniques to be utilized in extracting the hydrocarbons from the subsurface formation and the like.

As used herein, "hydrocarbon operations" refers to any activity associated with hydrocarbon exploration, hydrocarbon development and/or hydrocarbon production.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

As used herein, "subsurface model" refers to a reservoir model, geomechanical model, watertight model and/or a geologic model. The subsurface model may include subsurface data distributed within the model in two-dimensions (e.g., distributed into a plurality of cells, such as elements or blocks), three-dimensions (e.g., distributed into a plurality of voxels) or three or more dimensions.

As used herein, "geologic model" is three-dimensional model of the subsurface region having static properties and includes objects, such as faults and/or horizons, and properties, such as facies, lithology, porosity, permeability, or the proportion of sand and shale.

As used herein, "reservoir model" is a three-dimensional model of the subsurface that in addition to static properties, such as porosity and permeability, also has dynamic properties that vary over the timescale of resource extraction, such as fluid composition, pressure, and relative permeability.

As used herein, "simulation model" is a subsurface model that is utilized in simulating fluid flow and/or properties for a subsurface region as it varies over various time steps within a period of time. For example, a reservoir model may be used as a simulation model to simulate fluid flow properties, such as fluid composition, pressure, and relative permeability, during resource extraction for a period of time, such as ten years, twenty years or other designated period of time and associated time steps.

As used herein, "simulate" or "simulation" is the process of performing one or more operations using a simulation model and any associated properties to create simulation results. For example, a simulation may involve computing a prediction related to the resource extraction based on a reservoir model. A reservoir simulation may involve performing by execution of a reservoir-simulator computer program on a processor or on multiple processors in parallel, which computes composition, pressure, or movement of fluid as function of time and space for a specified scenario of injection and production wells by solving a set of reservoir fluid flow equations. A geomechanical simulation may involve performing by execution of a geomechanical simulator computer program on a processor or on multiple processors in parallel, which computes displacement, strain, stress, shear slip, energy release of the rock as a function of time and space in response to fluid extraction and injection.

In hydrocarbon operations, a subsurface model is created in the physical space or domain to represent the subsurface region. The subsurface model is a computerized representation of a subsurface region based on geophysical and geological observations made on and below the surface of the Earth. The subsurface model may be a numerical equivalent of a three-dimensional geological map complemented by a description of physical quantities in the domain of interest. The subsurface model may include multiple dimensions and is delineated by features, such as horizons and faults and may also model equipment disposed along the flow path for the fluids produced from the wellbore. The subsurface model may include a mesh or grid to divide the subsurface model into mesh elements, which may include cells or blocks in two-dimensions, voxels in three-dimensions or other suitable mesh elements in other dimensions. A mesh element is a subvolume of the space, which may be constructed from vertices within the mesh. In reservoir simulation, each mesh cell may be referred to as a node, while the interface between neighboring cells may be referred to as a connection. The portion of mesh representing wells and production facility network (e.g., wellheads, flow lines and junctions, separators, and/or other equipment at the surface of the wellbore) may include individual nodes or 1-dimensional segments of nodes and connections. As used herein, the term "object" refers to either a node and/or a connection representing part of a well or facility flow network. In the subsurface model, material properties, such as rock properties (e.g., permeability and/or porosity), may be represented as continuous volumes or unfaulted volumes in the design space, while the physical space may be represented as discontinuous volumes or faulted volumes (e.g., contain volume discontinuities, such as post-depositional faults).

Construction of a subsurface model is typically a multi-step process. Initially, a structural model or structural framework is created to include surfaces, such as faults, horizons, and if necessary, additional surfaces that bound the area of interest for the model. The framework provides closed volumes, which may be referred to as zones, subvolumes, compartments and/or containers. Then, each zone is meshed or partitioned into sub-volumes (e.g., mesh elements, such as cells or voxels) defined by a mesh (e.g., a 2-D mesh to a 3-D mesh). Once the partitioning is performed, properties are assigned to mesh elements (e.g., transmissibility) and individual sub-volumes (e.g., rock type, porosity, permeability, rock compressibility, or oil saturation).

The assignment of properties to mesh elements is often also a multistep process. For example, if the mesh elements are cells, each cell may first be assigned a rock type, and then each rock type is assigned spatially-correlated reservoir properties and/or fluid properties. Each cell in the subsurface model may be assigned a rock type. The distribution of the rock types within the subsurface model may be controlled by several methods, including map boundary polygons, rock type probability maps, or statistically emplaced based on concepts. In addition, the assignment of properties, such as rock type assignments, may be conditioned to well data.

Further, the reservoir properties may include reservoir quality parameters, such as porosity and permeability, but may include other properties, such as clay content, cementation factors, and other factors that affect the storage and deliverability of fluids contained in the pores of the rocks. Geostatistical techniques may be used to populate the cells with porosity and permeability values that are appropriate for the rock type of each cell. Rock pores are saturated with groundwater, oil or gas. Fluid saturations may be assigned to the different cells to indicate which fraction of their pore space is filled with the specified fluids. Fluid saturations and other fluid properties may be assigned deterministically or geostatistically.

In modeling subsurface regions, certain wells in the simulation models may have stability problems. Given a pressure or rate boundary condition at the wellhead or at a boundary node in the production facility network, mathematically there may not exist any solution to the flow equations or there may exist multiple solutions. If multiple solutions exist, some solutions may correspond to physically stable regime or others may correspond to physically unstable flow regime, which may not be used in practice. Numerically, the multi-phase flow problem constructed for the simulation may be unsolvable when a solution does not exist. On the other hand, computations may oscillate and diverge if multiple solutions exist. Even when there is a unique solution to the flow equations, the numerical computations may still fail to converge or may take too much computational time if the starting points or the initial estimates are far away from the true solution. Further, some simulation models may be performed in parallel. In such an example, the well management computations may be executed on one processor, while some wells and production facilities computations may be assigned to other processors. As a result, obtaining data, such as gas-oil ratio (GOR) and watercut (WCUT) necessary for well management, may involve expensive data communication between processors and/or computations.

The present techniques provide various enhancements by using stability proxies in subsurface models (e.g., simulation models) to provide stable and efficient reservoir simulations. The present techniques construct and use stability proxies to guide the setting of boundary conditions. The use of the stability proxies provides a mechanism to start a time step with accurate parameters (e.g., starting point for time step process). Further, the use of stability proxies provides useful information for well management in optimizing recovery of hydrocarbons from a subsurface reservoir.

In contrast to conventional approaches that guess well bottom-hole pressure based on reservoir pressure or rely upon simple stability validation, the present techniques derives stability proxies for use in managing the reservoir simulation. The method may include determining stability proxies by traversing from objects representing well bottom-hole location in the reservoir (e.g., reservoir interface at the well) to objects representing production facility network at the surface. The stability proxies are derived based on inflow and outflow to the respective object (e.g., node, connection, or well). The stability proxies may also merge at joint nodes, which may combine the connections and nodes downstream of the respective connection or node. After traversing from the reservoir to the surface, the boundary conditions are validated based on the stability proxy. Then, the method determines pressure and compositions at each node from stability proxy for downstream connections attached to the node by traversing from objects at the surface to the objects at the reservoir. Values of pressure and compositions may be used as initial guesses or starting points for the time step calculations.

In contrast to the conventional approaches that do not provide adequate stability analysis, if any, for coupled flow networks, the present techniques involve the use of stability proxies to provide enhancements for coupled flow networks. The present techniques use stability proxy construction method that changes rate values step-by-step to make the process robust and reliable. The interpolation of stability proxies provides efficiency advantages by reusing stability proxies to provide evaluation of complex flow scenarios. The stability proxy may be used as a general framework for supporting different well and/or production facilities modeling configurations for reservoir simulations.

In the present techniques, well management is typically performed at the beginning of each time step. The well management may be configured to handle various operational constraints, for example, maximum water handling capacity of the field, maximum separator flow capacity, gas flare limit, and the like and may also be configured to allocate production and/or injection rates among wells to satisfy the constraints and, at the same time, maximize oil and/or gas production. More specifically, well management may be configured to identify the set of wells to be opened for production and/or injection and may be configured to determine optimal settings or parameters in rate or pressure control for each well belonging to the open well set for the respective time step. The rate or pressure controls for wells may then become boundary conditions for solving the multiphase flow equations during the time step. Because reservoir pressure and saturation conditions change from time step to time step, well management is re-evaluated once every certain time period to respond to those changes.

The effective operation of well management calculations involves the ability to determine in a robust and efficient manner performance of well and facility network attached to the reservoir model. The procedure for obtaining well performance involves two aspects. The first aspect is determining whether it is possible to maintain the well open at the boundary condition specified. It is well known that flow in the well does not operate below a minimum stable rate (MSR) before the well becomes hydraulically unstable and has to be shut in. The second aspect is obtaining well pressure and/or rate data for open wells by solving the multiphase flow equations for wells and production facilities, possibly at fixed reservoir pressure and saturation conditions. Solving for MSR or pressure and/or rate values at specified boundary condition is a challenging computational task in reservoir simulation. The pressure drop relationships for multiphase flow in well and flow network are highly nonlinear. Steep changes often occur corresponding to a change in flow regimes, which may include annular mist, bubble, dispersed bubble, stratified flow, etc. Spurious issues are often present in those relationships for numerical reasons. During simulation, the pressure drop relationships may be represented in the form of hydraulic tables, which are difficult to visualize and validate. Hydraulic tables are multi-dimensional tables with multiple independent parameters and one or multiple dependent parameters. The independent parameters may include liquid rate, gas-oil ratio, water cut, pressure at downstream node object, among others, while dependent parameters may include pressure at the upstream node object, among others. Similar to flow in wells, flow from the reservoir into the wellbore may exhibit nonlinear behavior, which may be severe nonlinear behavior. For example, non-Darcy equation may be utilized to model high gas flow rate near the wellbore, and cross flow within the wellbore may occur when the well is perforated through different rock layers, which do not provide good pressure communication or connectivity. One technique used in reservoir simulators to solve the system of multiphase flow equations is the Newton-Raphson procedure or method, which may fail to converge or may perform an excessive number of iterations when nonlinearity is severe. Typical numerical problems that hinder convergence of Newton-Raphson procedure are: i) numerical overshoot; ii) pressure and/or rate values jumping outside hydraulic table bounds; iii) rate falling below MSR; and iv) pressure and/or rate values oscillating between iterations. For hydraulic flow networks, the boundary condition may be specified at a separator node downstream to the wellhead, and flow instability may occur at any segment of the wellbore or conduit network between bottom-hole and a separator, making even the determination of minimum stable rate difficult.

The present techniques use computational stability proxies for determining minimum stable rate and for generating stable and accurate initial estimates for solving multiphase flow equations. As the procedure is robust and efficient, it may be utilized for simple hydraulic well with the boundary condition specified at wellhead along with general flow networks with boundary condition set at separator nodes. The present techniques effectively lessen or eliminate numerical overshoot and oscillation, which are common to the conventional Newton-Raphson procedures or simulation approaches. The stability proxy provides well management an efficient method for obtaining flow performance in wells and at each level of the production facility network essential for optimizing field production.

The stability proxy is a representation of the physically stable portion of the flow performance of a well, or part of or an entire production flow network. The stability proxy may be a discrete dataset and may be constructed separately for each well and/or facility network object (e.g., node objects and/or connection objects). The computational stability proxy incorporates inflow (e.g., flow from reservoir into the wellbore) and outflow (e.g., flow through the wellbore, which may be in conduit or well tubing) or flow in network depending on the location of the object. In certain configurations, the stability proxy may be a one-dimensional (1D) table with multiple columns, which may be stability proxy table. For node objects, columns of parameters in the stability proxy table may include node pressure, mass rates of flow through the node object, and/or phase rates of flow through the node object. Each row of the stability proxy table represents mass and phase rate values of flow through the node at a given pressure value at the node object. For connection objects, columns of parameters in the stability proxy table are pressure at an upstream node object, pressure at the downstream node object, mass rates of flow though the connection, and phase rates of flow though the connection. Each row of the stability proxy table represents mass rate and phase rate values of flow through the connection object at a given pressure value at the upstream node object or downstream node object. The minimum rate entry in the stability proxy table corresponds to the minimum stable rate or the minimum rate due to indirect constraints present in the simulation model, for example, maximum pressure entry in the hydraulic table. The maximum rate entry corresponds to either the maximum rate in the hydraulic table or the maximum rate the well may flow given the pressure and/or saturation conditions in the reservoir. The range of the stability proxy table may also be limited by constraints on well production imposed by users, for example, maximum water production limit, gas flare limit, etc.

Generation of the stability proxy tables may use a sequential procedure starting from objects in the reservoir to objects at surface (e.g., from well bottom-hole nodes and tubing connections and traversing upward toward the separator node or a boundary node). The method may include various operations, such as various calculations or computations. The procedure may start from flow connection objects attached to bottom-most well node objects with perforations to the reservoir inflow (e.g., flow of fluid from reservoir into wellbore). The flow connection object may be assigned a hydraulic table for determining pressure drop across the connection. To begin, the well bottom-hole pressure (bhp) (or pressure for the upstream node of the connection object) is solved at a given rate, which corresponds to the maximum rate entry in the hydraulic table. If bhp is solved successfully (e.g., converged within a specific threshold), then well rate, gas-oil ratio, water cut, and other parameters may be calculated from inflow and used to look-up for wellhead pressure (whp) (or pressure for the downstream node object of the connection object) using the hydraulic table. Interpolation may be required during table look-up if rate or other independent parameter value falls in between two table entry points for the respective parameter. If both bhp and whp are obtained successfully, then the two pressure values as well as mass rates and phase rates are stored into memory as a possible entry in the stability proxy table. The process is then repeated for next lower rate entries in the hydraulic table. The hydraulic table may include pressure drop or other parameters for a section of conduit and may be used as an input into the stability proxy. At each step of the stability proxy generation process, a new whp is compared to the whp from the previous step if existing to ensure that the stability condition is satisfied (e.g., whp increases with decreasing rate for producer wells and opposite for injection wells). If the solution of bhp and/or whp fails or stability condition is violated, the process is interrupted if the stability proxy table includes a reasonable number of valid entries. On the other hand, if solution of bhp and/or whp fails or the stability condition is violated, but the pressure or rate range of the stability proxy table is deemed too narrow, all existing entries in the stability proxy table are removed and the stability analysis is restarted from the current rate entry as the potential maximum rate for the stability proxy table. As a by-product of the process to create stability proxies for the connection objects at the bottom, proxies may be generated for the corresponding bottom well node objects by recording the successful solutions of reservoir inflow mass rates and phase rates and the corresponding value of the well bottom-hole pressure (pressure for the well node objects).

The present techniques involve a discrete approach for building the stability proxy, which provides several benefits. For example, the stability proxy approach does not involve computing second order derivatives, which may be necessary in conventional methods for determining the minimum stable rate, but may be unreliable due to a non-smooth nature of the flow behaviors in reservoir and in wells. Further, the present techniques involve solving bhp for a given rate target. To enhance robustness in the method, a combination of Newton and Secant methods may be performed to improve convergence. Because the bottom-hole pressure computation is performed in series for different rate values, each bhp solution is used as the initial guess or estimate for the next bhp solve to minimize iteration count and further improve convergence. The process of stability proxy construction is highly flexible. The accuracy and resolution of the stability proxy may be enhanced by adding rate points between the rate entries in the hydraulic table.

After construction of stability proxy is completed for flow connection objects attached to bottom-most well node objects, the operation is shifted to the node objects on the downstream side of those connection objects. For node objects with only a single upstream flow branch, the stability proxy is the same as that for the connection object, except that the column of downstream node pressure in the connection stability proxy is now the node pressure, while the column of upstream node object is not relevant and is removed. For node objects with multiple upstream connection objects feeding into the node objects, the stability proxy may be obtained by merging the stability proxies for individual upstream connection objects. In the merge operation, a stability proxy range for the node pressure is first determined based on the ranges for downstream node pressure of the proxies for the upstream connection objects. For example, one approach is to choose intersection or the common interval of the stability proxy ranges for upstream connection objects, as the stability proxy range for the node object. This assumes that the upstream connection objects are active and open to flow. Any inactive connection object may be excluded in the calculation of the range or other stability proxy-related calculations for the downstream node object. After the stability proxy range is determined for node pressure, the stability range may be divided into a number of segments to provide proper resolution for the stability proxy. Each discrete node pressure value, which is the end point of a segment, is used as downstream node pressure to look-up the corresponding mass flow rates from stability proxy table for each upstream connection object. Again, interpolation may be utilized in the table look-up process. Then, the resulting mass flow rates from different upstream connection objects are summed up to yield the mass flow rates through the node object. The phase rates through the node object may be determined by performing phase equilibrium calculations. The node pressure, node mass and phase flow rates are stored as an entry in the stability proxy table for the node. The construction of stability proxy table for the node object is completed after the process is performed for each discrete node pressure value within the range.

As the traversal scheme for stability proxy construction continues, the operation is next performed for connection objects if any immediately downstream to the node objects just processed. For those connection objects, the stability proxy for the node object is used to determine amount of inflows analogous to inflow performance relationship for well node objects with reservoir perforations. As a result, the stability proxy construction for the new connection object may resemble that for the bottom connection objects, with reservoir inflow now replaced by the pressure and/or rate flow relationship prescribed in the stability proxy table for the node object.

After the stability proxy tables are built for the bottom connection and node, the process of the stability proxy generation then traverses downstream from the reservoir to the production facility network until the separator node object is reached (or boundary node object where boundary condition is imposed. At each step, the process uses proxies built for objects upstream along the flow path of the production facility network. For each object downstream to bottom-hole objects, the generation of stability proxy is performed only after the stability proxy has been created for each connection object attached to the object on the reservoir side.

The stability proxy obtained for each object provides an accurate representation of the behavior of the subset of wells and production flow network for the object being processed and other objects upstream to it along the flow path. The stability proxy yields not only a stable operating range for different pressure or rate parameter but also qualitative information of how flow composition (e.g., gas-oil ratio, watercut, etc.) changes with pressure or production rate essential for optimizing recovery.

By way of example, the present techniques may be utilized with wells and production facility network in a sequential process for constructing flow stability proxy (traversing from downhole locations toward the production facility network) and for flow initialization (e.g., traversing from the production facility network toward the downhole locations).

Once the computational stability proxies are created for well objects and the facility network objects, the proxies may be used to enhance various operations. For example, the proxies may be used to validate rate or pressure boundary condition to ensure that the resulting flow is stable and within the valid range. To validate boundary conditions, the pressure or rate boundary condition may be compared against a pressure range or a rate range in the stability proxy for the object where the boundary condition is imposed. When the constraint value (e.g., boundary condition) is within the range, the well object or facility network object may be open to fluid flow. Otherwise, the well object or facility network or subset of it may be closed to fluid flow (e.g. for a well object it may be shut in).

Also, the proxies may be used to generate accurate and stable initial estimates or guesses for solving multiphase flow equations as part of well management calculations or global time step calculations. A good initial estimate may lessen problems with solving nonlinear problems. Indeed, nonlinear solvers that use Newton-Raphson method may have difficulties converging if the starting point or initial estimate of the iteration is distant or remote from the true solution. In contrast, nonlinear solvers typically converge rapidly when the starting point is close to the true solution. The generation of accurate initial guesses for pressure, flow rates, compositions, and other parameters for the simulation may be performed by using stability proxies in the order starting from the boundary node object and traversing downward toward the reservoir. First, the constraint value, as part of the boundary condition, is used to look-up values of pressure, flow rates, and other parameters for the boundary node object from the stability proxy built for that node object. During the table look-up process, interpolation may be used if the values of the parameters are between two table entries. The resulting values of pressure, flow rates, compositions (derived from mass flow rates), and other parameters are set as initial guesses for those parameters for the boundary node object. Once the initial estimates for the boundary node objects are obtained, connection objects on the reservoir side attached to the boundary node object are processed. For those connection objects, the initial guess for pressure at the boundary node object is used as the downstream node pressure to look-up values of upstream node pressure, mass rates, and phase rates for the upstream node object from the stability proxy table built for the connection object. Similarly, the resulting values of pressure, flow rates, compositions, and other parameters are set as initial guesses for those parameters for the node object on the upstream side of the connection object. Once completed, the same procedure is repeated for the connection object attached to the processed connection object on the reservoir side. This procedure continues until initial guesses for all wells and facility node objects are obtained.

Furthermore, the flow performance data may be provided for well management as a basis for determining optimal control settings to maximize oil and/or gas recovery. The stability proxy data may contain information on how gas rate, oil rate, water rate vary with constraint pressure or rate at the boundary node. As a result, given any boundary condition, well management may obtain the different phase rates for each node object or connection object from the associated stability proxy using a simple table look-up. By using look-up, the simulator computations are more efficient as compared to existing approaches, which typically involve a complicated iterative solve step to obtain the similar information. The phase rate results, along with computed gas-oil ratio, water cut, and/or other parameters may provide a mechanism to effectively identify wells (or even other zones) to be opened for production and/or injection operations and to allocate flow rates among different wells for the purpose of maximizing oil and/or gas recovery.

The stability proxies may be used to enhance the simulation. For example, the stability proxies may be used to validate boundary conditions for the simulation at respective boundary objects. The initial parameters in the respective stability proxy may be ranges for different values at a given object. Then, initial values may be selected for properties, such as saturation, pressure and/or composition, which may be used in the flow equations for a give boundary condition to determine the solution variables at the object. The solution variables may be used with the stability proxy for the next upstream object to determine the initial values for the equations associated with that object. Accordingly, this process is repeated until a boundary object has been reached.

To enhance the reservoir simulations, the present techniques provide enhancements to the creation and generation of stability proxies in subsurface models to provide stable and efficient reservoir simulations. For example, in one embodiment, a method for creating and using stability proxies for hydrocarbon operations in a subsurface region is described. The method comprising: obtaining a simulation model associated with a portion of a reservoir, one or more wells and production facilities, the simulation model includes a plurality of objects, wherein each of the plurality of objects represents a portion of a well or a production facility network; creating a stability proxy for each of the plurality of objects to form stability proxies or stability proxy sets; determining initialization parameters for the well and production facility network based on the created stability proxies; performing a reservoir simulation based on the initialization parameters; and outputting the simulation results.

In another embodiment, a method for creating and using stability proxies for hydrocarbon operations in a subsurface region is described. The method comprising: obtaining a simulation model associated with a portion of a reservoir, one or more wells and production facilities, the simulation model includes a plurality of objects, wherein each of the plurality of objects represents a portion of a well or a production facility network and the plurality of objects include one or more of a node object, a connection object and any combination thereof creating a stability proxy for each of the plurality of objects to form stability proxies; determining initialization parameters for the well and production facility network based on the created stability proxies; performing a reservoir simulation based on the initialization parameters; and outputting the simulation results, wherein the simulation results comprise one or more of pressure, injection flow rate, production flow rate and any combination thereof.

In certain configurations, the method may include various enhancements. For example, the method may include wherein each of the stability proxies comprise a set of equations; wherein the stability proxy is a discrete dataset and is constructed separately for each of the plurality of objects; determining whether each of the stability proxies provides sufficient resolution; and adding data to the table when the resolution is not sufficient; wherein the stability proxy is a one-dimensional (1D) table with one or more columns associated with values for fluid flow within the respective objects; wherein the one or more columns comprise one or more of pressure, mass rate of flow, and phase rate of flow; wherein the one or more columns comprise a range of values from a minimum value to a maximum value; wherein creating the stability proxy comprises calculating only first order derivatives; wherein creating the stability proxy for each of the plurality of objects further comprises creating a first stability proxy for a first object closest to the reservoir and then creating additional stability proxies for each of the plurality of objects by traversing downstream from the first object; providing the stability proxies to a well management module to optimize production; validating boundary conditions based on the stability proxies associated with a boundary object of the plurality of objects; performing a look-up to set the initial values for the boundary object; determining initial values for each of the plurality of objects upstream of the boundary object; determining initial values for each object of the plurality of objects from the boundary object by traversing upstream from each connected object to the subsequent object until a base object is reached; modifying one of the plurality of objects; and/or based on the modified one of the plurality of objects, adjusting the stability proxies downstream of the modified one of the plurality of objects and continuing to use the stability proxies for each of the plurality of objects upstream of the modified one of the plurality of objects. The present techniques may be further understood with reference to FIGS. 1 to 5, which are described further below.

FIG. 1 is an exemplary flow chart 100 in accordance with an embodiment of the present techniques. The flow chart 100 includes a method for creating and using stability proxies for simulations of a simulation model and using the results of the simulation for hydrocarbon operations. The method may include obtaining a simulation model and creating stability proxies, as shown in blocks 102 to 104. Then, the stability proxies are utilized in time steps and Newton iterations for the simulation, as shown in blocks 106 to 114. Finally, the simulation results may be retrieved from storage media and utilized for hydrocarbon operations, as shown in blocks 116 and 118.

To begin, the method involves obtaining a simulation model and creating stability proxies, as shown in blocks 102 to 104. At block 102, a simulation model for a subsurface region that represents a reservoir, wells and production facility network is obtained. The simulation model may be a reservoir model having mesh elements, which are assigned properties that may include transmissibility, rock type, porosity, permeability, rock compressibility, oil saturation, clay content and/or cementation factors, for example. Then, stability proxies may be created for the simulation model, as shown in block 104. The creation of the stability proxies may be formed for each time step and/or Newton iteration. The stability proxies may be created by traversing from the reservoir (e.g., through a portion of the grid representing the reservoir) through various objects in wells and the production facility network. The objects may be connection objects and node objects, which represent various portions or regions of the fluid flow path from the reservoir to the production facility network.

Then, the stability proxies are utilized in time steps and/or Newton iterations for a simulation of fluid flow, as shown in blocks 106 to 114. In block 106, the stability proxies are used to determine initialization parameters for well and production facility network. The stability proxies may be used for initialization by traversing from surface locations (e.g., objects in the production facility network) to the reservoir (e.g., well node objects and connection objects). At block 108, the initialization parameters are used for time intervals. The time intervals may include time steps, Newton iterations and/or suitable time intervals. Then, at block 110, the well rates and pressures for each time interval may be output. The outputting of the well rates and pressures may involve storing the well rates and pressures in memory and/or displaying the well rates and pressures and/or writing the data to memory.

Once the calculations for a time interval are complete, a determination is made whether the time intervals are complete, as shown in block 112. If the time intervals are not complete, the time interval is incremented, as shown in block 114 and the process returns to block 104 to create stability proxies for the next time step. If the time steps are complete, the process continues by retrieving and analyzing simulation results and using the simulation results for hydrocarbon operations, as shown in blocks 116 and 118.

The simulation results may be retrieved and analyzed as shown in block 116. The simulation results may include representations of fluid flow based on the reservoir model and the associated properties stored within the mesh elements of the reservoir model. The simulation results may include the computation of time-varying fluid pressure and fluid compositions (e.g., oil, water, and gas saturation) and the prediction of fluid volumes produced or injected at wells. At block 118, the simulation results may be utilized in hydrocarbon operations. The hydrocarbon operations may include hydrocarbon exploration operations, hydrocarbon development operations and/or hydrocarbon production operations. For example, the simulation results may be used to estimate or adjust reserves forecasts, reserves estimations and/or well performance prediction. As another example, the simulation results may be used to adjust hydrocarbon production operations, such as installing or modifying a well or completion, modifying or adjusting drilling operations, decreasing fracture penetration, and/or to installing or modifying a production facility. The production facilities may include one or more units to process and manage the flow of production fluids, such as hydrocarbons and/or water, from the formation.

Beneficially, this method provides an enhancement in the production, development and/or exploration of hydrocarbons. In particular, the method may be utilized to enhance simulations by providing stability, which may result in less computational effort, less interactive intervention, faster convergence, and more reliable and robust time stepping. As a result, this may provide enhancements to production at lower costs and lower risk.

As may be appreciated, the blocks of FIG. 1 may be omitted, repeated, performed in a different order, or augmented with additional steps not shown in FIG. 1. Some blocks may be performed sequentially, while others may be executed simultaneously or concurrently in parallel. Simultaneously means performance at the same time, while concurrently means performance overlapping at time periods. For example, in certain embodiments, different wells may be assigned to different processors and the construction of stability proxies for node objects and/or connection objects inside a well may be performed in parallel to the construction of proxies for other wells. The stability proxy results may then be sent to the processors which manage the node objects or connection objects downstream for the purpose of stability proxy construction for those objects. As another example, stability proxies may be reused rather than recreated for every time step.

Figure 2:
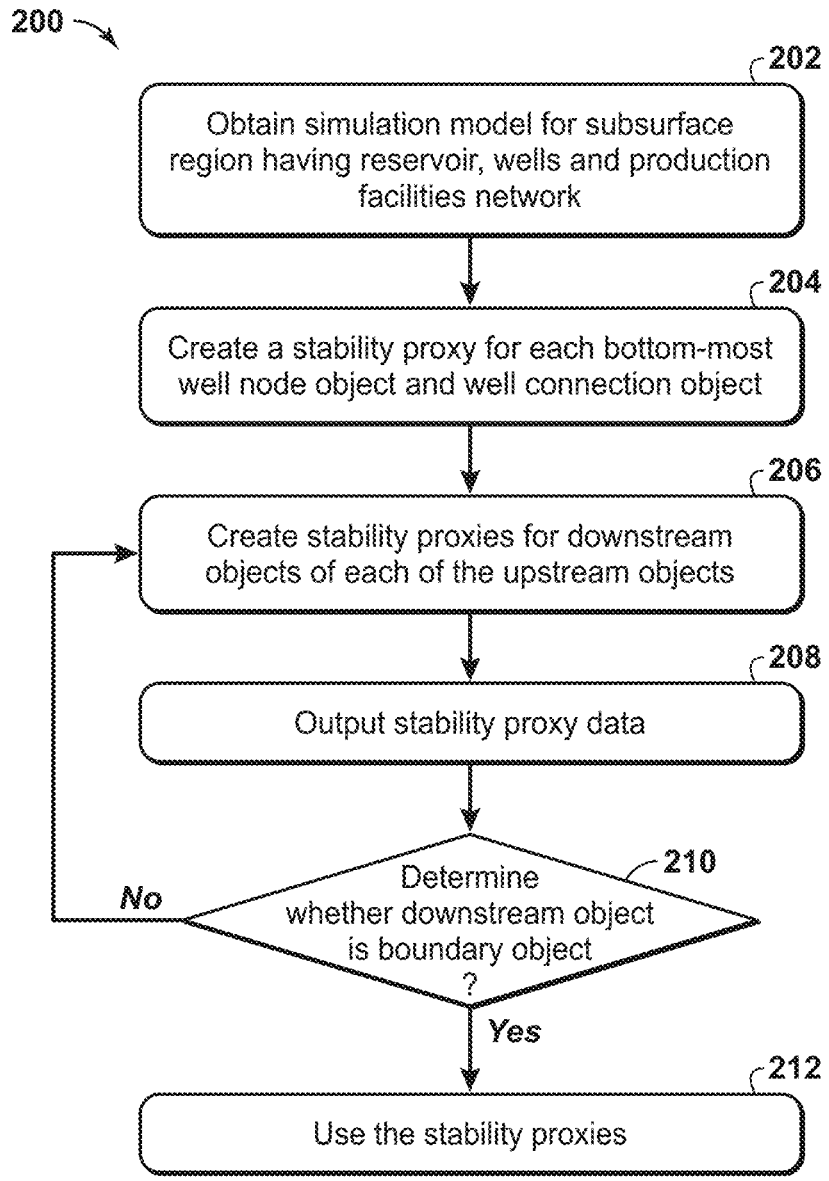
FIG. 2 is an exemplary flow chart of creating stability proxies in accordance with an embodiment of the present techniques.

As a further enhancement, FIG. 2 is an exemplary flow chart 200 of creating stability proxies in accordance with an embodiment of the present techniques. The flow chart 200 includes an exemplary method for creating stability proxies, which are described above in block 104 of FIG. 1. The method may include obtaining a simulation model, as shown in block 202. Then, the creating of stability proxies may start from the upstream objects and traverse downstream to the surface objects, as shown in blocks 204 to 210. Finally, the stability proxies may be retrieved from memory for use in time step computation, as shown in block 212.

To begin, the method involves obtaining a simulation model, as shown in block 202. At block 202, a simulation model for a subsurface region having reservoir, wells and production facility networks is obtained. The simulation model may be similar to the simulation model described in block 102 of FIG. 1.

Then, the stability proxies are created, as shown in blocks 204 to 210. In block 204, the stability proxies are created for each of the bottom-most node objects and/or connection objects. For example, the bottom-most objects may be bottom well node objects, which are connected with the reservoir and have inflow from the subsurface formation. The bottom well node objects may represent perforations within a zone of a well or a completion component that interfaces with the reservoir fluids within the well, for example. Then, stability proxies are created for downstream objects of each of the upstream objects, as shown in block 206. The creation of the stability proxies for the downstream objects may utilize table look-up and interpolation to calculate the stability proxies for the downstream nodes and/or may merge two or more upstream stability proxies at a downstream object if the downstream object is an interface or joining point of two or more different upstream objects. The upstream object may be the object that is upstream of the respective downstream object. For example, if the upstream object is a well node object or connection object, the downstream object may be a node object or connection object in fluid communication with the well node object or connection object. If only an upstream connection object is connected to one downstream node object, the downstream node object may use the same stability proxy as the upstream connection object with the table column corresponding to upstream node pressure removed. However, if the downstream node object is coupled to two or more upstream connection objects, the stability proxy for the downstream object may be calculated by merging the stability proxies from the upstream objects, which may involve table look-up and interpolating between the associated upstream stability proxies. For downstream connection objects, the stability proxy for the upstream node object is used to determine amount of inflows analogous to inflow performance relationship for well node objects with reservoir perforations. As a result, the stability proxy construction for the downstream connection object may resemble that for the bottom well node object and attached connection object, with reservoir inflow now replaced by the pressure and/or rate flow relationship prescribed in the proxy table for the node object. In block 208, the stability proxy data is output. The outputting of the stability proxies may include storing the stability proxies in memory and/or displaying the stability proxies. Then, at block 210, a determination is made whether the processed object is a boundary object. A boundary object may be node objects representing separators or where a rate or pressure boundary condition is imposed. If the processed object is not a boundary object, then the process returns to block 206 and additional stability proxies are created for other downstream objects.

However, if the object just processed is a boundary object, then the stability proxies are used, as shown in block 212. The use of the stability proxies may include determining initialization parameters based on the stability proxies; outputting the stability proxies to well management, optimizing production based on the stability proxies and/or setting stable boundary conditions based on the stability proxies.

Beneficially, creating the stability proxies in the method provides an enhancement in the determination of a stable operating range for each node or connection object. It also yields an accurate representation of the behavior of each subset of wells and production facility network. The step-by-step method for the construction of proxies as shown in FIG. 2 makes it easy to identify the source of the problem should the stability proxy be invalid. An invalid stability proxy may have a range that is too narrow or do not contain any valid rate and/or pressure entry.

As may be appreciated, the blocks of FIG. 2 may be omitted, repeated, performed in a different order, or augmented with additional steps not shown in FIG. 2. Some blocks may be performed sequentially, while others may be executed simultaneously or concurrently. For example, in certain configurations, the operating range in the stability proxy may be too narrow, which may indicate that input provided for the pressure drop calculations, for example, hydraulic tables, may have to be expanded. In that situation, new tables for the pressure drop calculations may be inputted and the stability proxies regenerated. As other examples, multiple sets of stability proxies may be created corresponding to different well events. As a specific example, a shut-in of a subset of wells may be performed because the subset of wells are not capable of producing at the pressure or rate condition imposed at the boundary. In certain configurations, well management may evaluate different operation scenarios, including different gas lift settings, rerouting production flowline from high pressure separator to low pressure separator or vice versa, among others. In such scenarios, the stability proxies for the effected node or connection objects and for objects downstream along the flow path may be regenerated, while stability proxies for objects upstream to the effected objects may be reused to save computational cost. In other configurations, the generation of a stability proxy table entry may involve solving for flow rate at given bhp rather than solving for bhp at given rate; or the hydraulic table may have different sets of independent parameters and dependent parameters; or the input for determining pressure drop across the connection may be a set of analytical equations rather than a hydraulic table; or stability condition may be based on comparison of slopes between inflow curve (e.g., bhp as a function of reservoir inflow rate) and outflow curve (e.g., bhp as a function of rate in the attached connection on the well side at fixed whp). In certain embodiments, the output of stability proxy may involve sending proxy data to other processors in a parallel computational environment.

Figure 3:
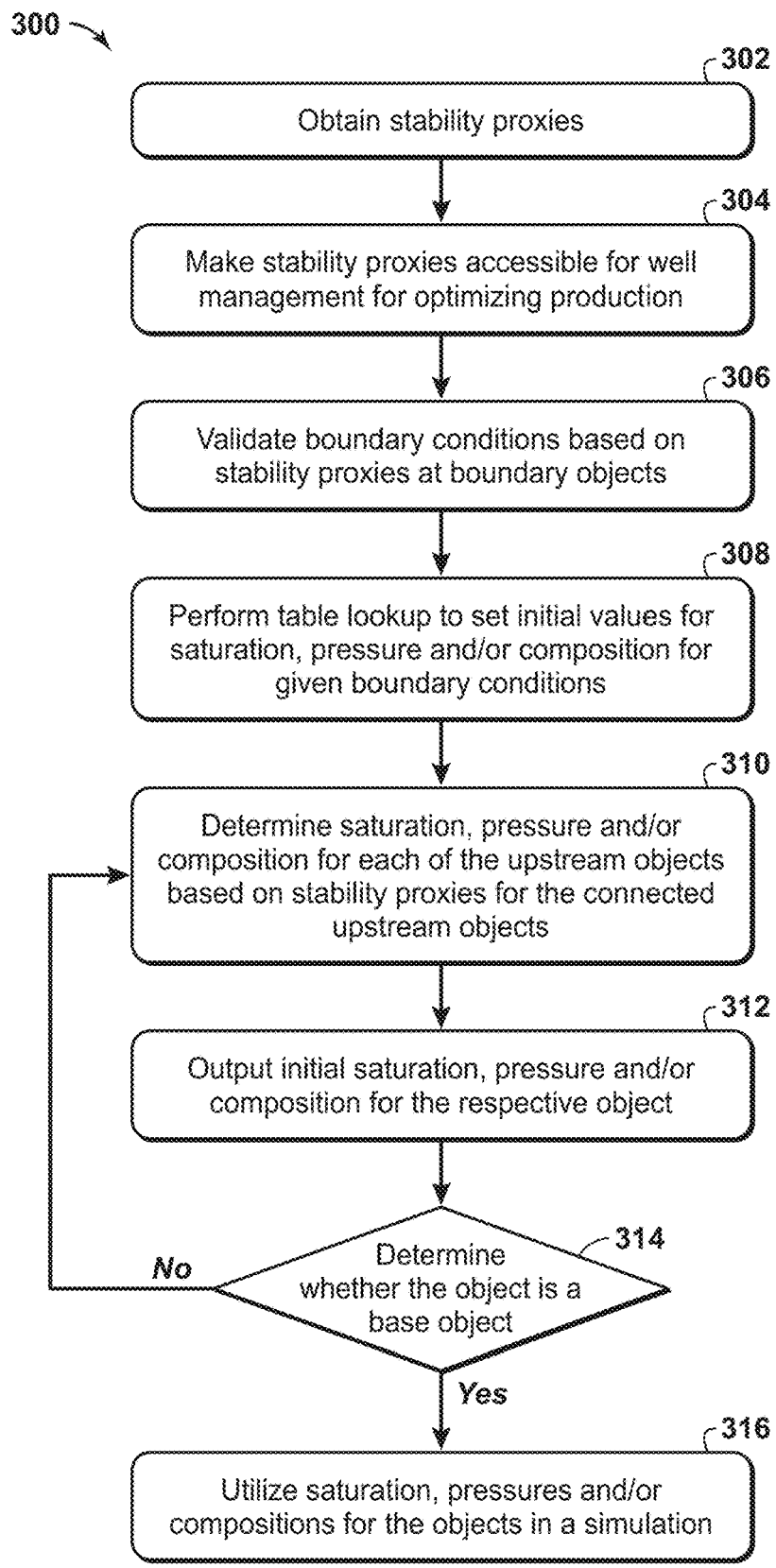
FIG. 3 is an exemplary flow chart of using stability proxies in accordance with an embodiment of the present techniques.

As a further enhancement, FIG. 3 is an exemplary flow chart 300 of using stability proxies in accordance with an embodiment of the present techniques. The flow chart 300 includes an exemplary method for using stability proxies, which are described above in block 106 of FIG. 1. The method may include obtaining stability proxies, as shown in block 302. Then, the stability proxies may be utilized in performing a reservoir simulation that involves well management, which is performed for different time steps and/or Newton iterations, as shown in blocks 304 to 314. Finally, the initial pressures and compositions may be stored and used for performing the reservoir simulation time step calculations, as shown in block 316.

To begin, the method involves obtaining stability proxies, as shown in block 302. At block 302, stability proxies are obtained. The stability proxies associated with a simulation model of a subsurface region, which may represent a reservoir, one or more wells and the production facility network. The obtaining the stability proxies may include accessing memory to obtain the previously created stability proxies and/or may include accessing the stability proxies, which may be created from a process, such as the flow chart of FIG. 2.

Once the stability proxies are obtained, the stability proxies are utilized in preparing for performing a reservoir simulation that involves well management for the different time steps and/or Newton iterations, as shown in blocks 304 to 314. In block 304, the stability proxies are made accessible for well management to optimize production. For that purpose, well management may compute gas-oil ratio and water cut from the stability proxies and then may allocate higher production rates to wells with lower GOR and/or WCUT to increase oil production for the field. In block 306, the boundary conditions are validated based on the stability proxies at boundary objects. The verification may include verifying that the rate or pressure constraint is within the range of the stability proxy. Then, table look-ups supplemented with interpolation are performed using the stability proxy table to obtain initial values for saturation, pressures and/or compositions for given boundary conditions, as shown in block 308. The resulting pressure and composition values are used to initialize the solution variables (e.g., pressure, temperature and saturation) for the boundary objects. Then, at block 310, saturation, pressure and/or compositions are determined by similar table look-up operation for each of the upstream objects based on the stability proxies for the respective connected upstream objects. The determination may also utilize the initial pressure value already found at the downstream object that is connected to this object. The resulting saturation, pressure and/or composition are used to initialize the solution variables for the upstream object connected to that object (e.g., node of the connection). Then, the saturation, pressure and/or compositions are output for the respective object, as shown in block 312. The outputting of the saturation, pressures and compositions may involve storing the pressures and compositions in memory. Then, a determination is made whether the object is a base object, as shown in block 314. The base object or starting object is an object at the starting point of the flow path. For example, the base object may be an object at the bottom of the flow path, such as perforations or a portion of the reservoir. If the object is not a base object, then saturation, pressure and/or compositions are determined for each of the additional upstream objects based on the stability proxies for the respective upstream objects, as shown in block 310.

However, if the object is a base object, then the saturations, pressures and compositions may be retrieved and utilized as the starting point for the reservoir simulation, as shown in block 316. The reservoir simulation may involve performing time stepping and/or Newton iterations. The saturations, pressures and compositions may be stored in memory and/or used for performing the reservoir simulation calculations for time steps and/or Newton iterations.

Beneficially, using the stability proxies in the method provides an enhancement in the ability of the simulator to set feasible boundary conditions for the wells and production facility network. As a result, well management may be provided a mechanism to assist in making informed decision on allocation of production among wells to maximize the production of hydrocarbons. Initializing the solution variables using stability proxy as described in the method provides stable and accurate starting point for the simulation time stepping or Newton iteration to provide fast convergence and high computational efficiency.

As may be appreciated, the blocks of FIG. 3 may be omitted, repeated, performed in a different order, or augmented with additional steps not shown in FIG. 3. Some blocks may be performed sequentially, while others may be executed simultaneously or concurrently. For example, in certain configurations, initial guesses for pressure and composition values may be sent from one processor to another which owns the connection and node upstream in order for the initialization process to continue.

Figure 4:
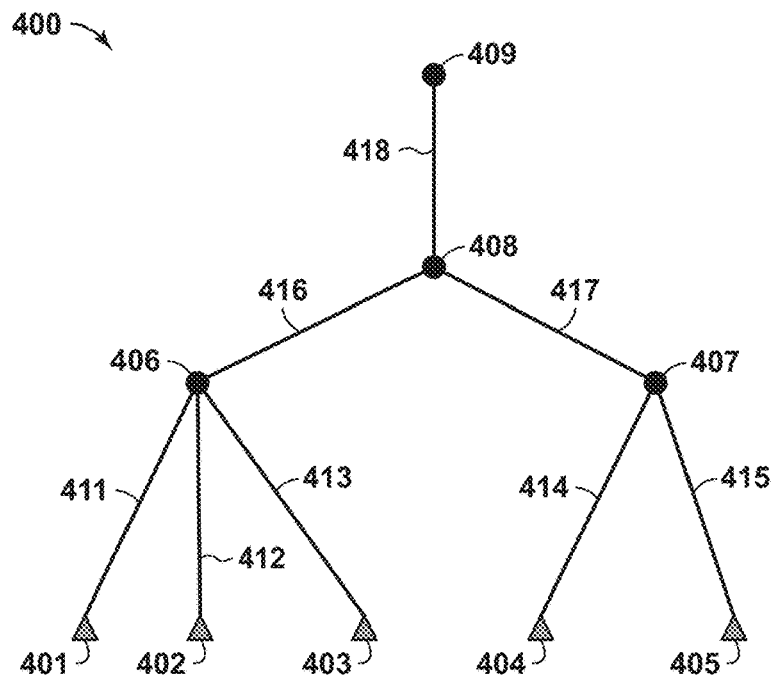
FIG. 4 is a diagram of exemplary structures for wells and production facility network.

FIG. 4 is a diagram 400 of an exemplary structure for wells and production facility network. In the diagram 400, various node objects, such as node objects 401 to 409, and connection objects, such as connection objects 411 to 418, are utilized to represent the objects within the simulation model. The node objects 401, 402, 403, 404 and 405 may represent bottom well node objects, while the node objects 406, 407 and 408 may represent node objects within a well or outside the well in the production facility network, and the node object 409 may represent a boundary object. The connection objects 411 to 418 may represent the well tubing or flowline or various conduits or fluid passages between the respective node objects.

By way of example, the creation of stability proxies may begin at the upstream objects and progress to the boundary node object 409, as described above in FIG. 2. For example, the stability proxies may be determined in the following order of connection object 411, connection object 412, connection object 413, node object 406 and connection object 416, connection object 414, connection object 415, node object 407, connection object 417, node object 408, connection object 418 and node object 409. As discussed above, the construction of stability proxies for connection objects 411, 412, 413, 414, and 415 also yields as by-product stability proxies for node objects 401, 402, 403, 404, and 405. In this manner, the stability proxies are created in sequence by traversing the structure from the upstream objects initially and then progressing to the boundary object, which is node object 409.

As yet another example, the use of stability proxies may begin at the downstream objects, such as the boundary node object 409, and progress to the well bottom node objects 401, 402, 403, 404 and 405, as described above in FIG. 3. For example, the pressures and compositions for node object 409 may be determined based on the stability proxy for the boundary node object. Then, the pressure and composition for other node objects may be computed from the proxies for the corresponding connections in the following order: node object 408 (from connection object 418), node object 406 (from connection object 416), node object 401 (from connection object 411), node object 402 (from connection object 412), node object 403 (from connection object 413), node object 407 (from connection object 417), node object 404 (from connection object 414), node object 405 (from connection object 415). In this manner, the pressures and compositions are determined in sequence by traversing the structure from the downstream objects initially and then progressing to the upstream objects, such as node object 405.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "comparing", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the present invention is in no way limited to implementation in any specific operating system or environment.

Figure 5:
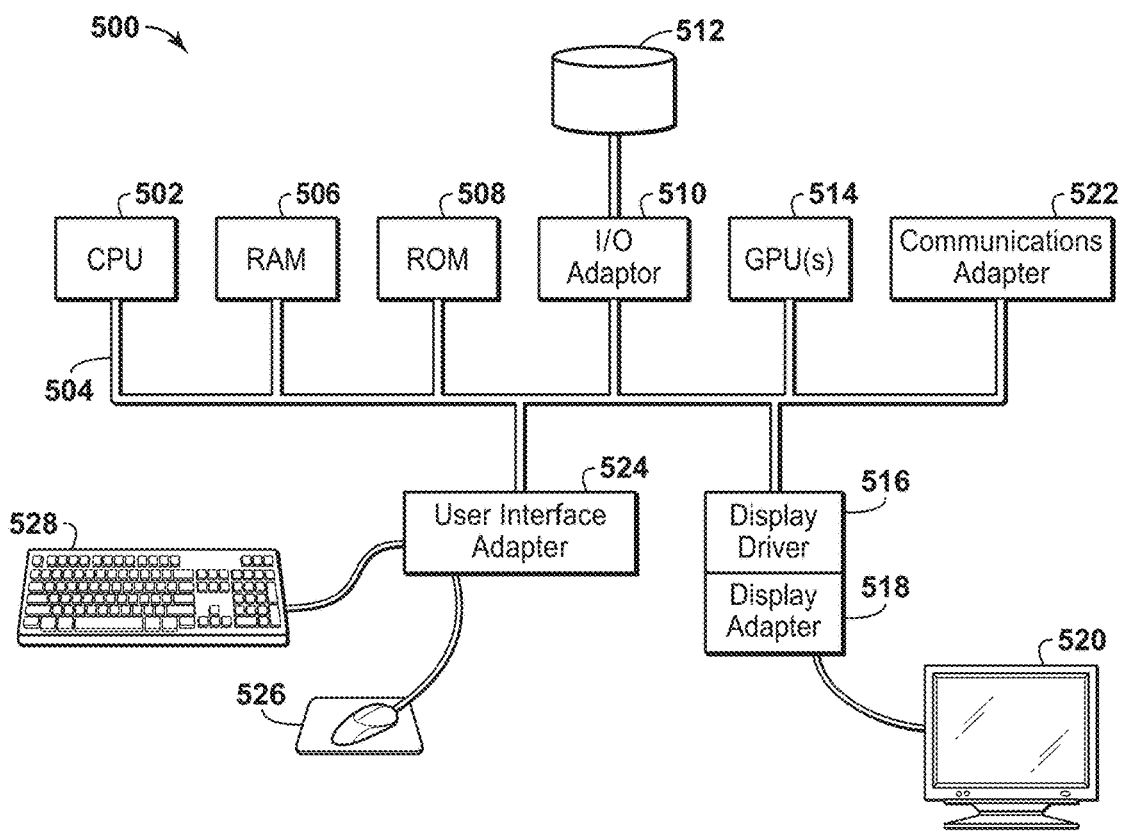
FIG. 5 is a block diagram of a computer system that may be used to perform any of the methods disclosed herein.

As an example, FIG. 5 is a block diagram of a computer system 500 that may be used to perform any of the methods disclosed herein. A central processing unit (CPU) 502 is coupled to system bus 504. The CPU 502 may be any general-purpose CPU, although other types of architectures of CPU 502 (or other components of exemplary system 500) may be used as long as CPU 502 (and other components of system 500) supports the inventive operations as described herein. The CPU 502 may execute the various logical instructions according to disclosed aspects and methodologies. For example, the CPU 502 may execute machine-level instructions for performing processing according to aspects and methodologies disclosed herein.

The computer system 500 may also include computer components such as a random access memory (RAM) 506, which may be SRAM, DRAM, SDRAM, or the like. The computer system 500 may also include read-only memory (ROM) 508, which may be PROM, EPROM, EEPROM, or the like. RAM 506 and ROM 508 hold user and system data and programs, as is known in the art. The computer system 500 may also include an input/output (I/O) adapter 510, a graphical processor unit(s) 514 (GPU(s)), a communications adapter 522, a user interface adapter 524, and a display adapter 518. The I/O adapter 510, the user interface adapter 524, and/or communications adapter 522 may, in certain aspects and techniques, enable a user to interact with computer system 500 to input information.

The I/O adapter 510 preferably connects a storage device(s) 512, such as one or more of hard drive, compact disc (CD) drive, floppy disk drive, tape drive, etc. to computer system 500. The storage device(s) may be used when RAM 506 is insufficient for the memory requirements associated with storing data for operations of embodiments of the present techniques. The data storage of the computer system 500 may be used for storing information and/or other data used or generated as disclosed herein. The communications adapter 522 may couple the computer system 500 to a network (not shown), which may enable information to be input to and/or output from system 500 via the network (for example, a wide-area network, a local-area network, a wireless network, any combination of the foregoing). User interface adapter 524 couples user input devices, such as a keyboard 528, a pointing device 526, and the like, to computer system 500. The display adapter 518 is driven by the CPU 502 to control, through a display driver 516, the display on a display device 520.

The architecture of system 500 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

As may be appreciated, the method may be implemented in machine-readable logic, such that a set of instructions or code that, when executed, performs the instructions or operations from memory. By way of example, the computer system includes a processor; an input device and memory. The input device is in communication with the processor and is configured to receive input data associated with a subsurface region. The memory is in communication with the processor and the memory has a set of instructions, wherein the set of instructions, when executed by the processor, are configured to: obtain a simulation model associated with a portion of a reservoir, one or more wells and production facilities, the simulation model includes a plurality of objects, wherein each of the plurality of objects represents a portion of a well or a production facility network; create a stability proxy for each of the plurality of objects to form stability proxy sets; determine initialization parameters for the well and production facility network based on the created stability proxies; perform a reservoir simulation based on the initialization parameters; and output the simulation results.

In another configuration, a system for creating and using stability proxies for hydrocarbon operations in a subsurface region is described. The system comprises: a processor; an input device in communication with the processor and is configured to receive input data associated with a subsurface region; and memory in communication with the processor and having a set of instructions, wherein the set of instructions, when executed by the processor, are configured to: obtain a simulation model associated with a portion of a reservoir, one or more wells and production facilities, the simulation model includes a plurality of objects, wherein each of the plurality of objects represents a portion of a well or a production facility network and the plurality of objects include one or more of a node object, a connection object and any combination thereof; create a stability proxy for each of the plurality of objects to form stability proxies; determine initialization parameters for the well and production facility network based on the created stability proxies; perform a reservoir simulation based on the initialization parameters; and output the simulation results, wherein the simulation results comprise one or more of pressure, injection flow rate, production flow rate and any combination thereof.

In certain configurations, the system may include various enhancements. For example, the system may include wherein each of the stability proxies comprise a set of equations; wherein the stability proxy is a discrete dataset and is constructed separately for each of the plurality of objects; wherein the stability proxy is a one-dimensional (1D) table with one or more columns associated with values for fluid flow within the respective objects; wherein the one or more columns comprise one or more of pressure, mass rate of flow, and phase rate of flow; and wherein the one or more columns comprise a range of values from a minimum value to a maximum value. Further, the set of instructions, when executed by the processor, may be further configured to: determine whether each of the stability proxies provides sufficient resolution; and add data to the table when the resolution is not sufficient; calculate only first order derivatives to create the each stability proxy; create a first stability proxy for a first object closest to the reservoir and then create additional stability proxies for each of the plurality of objects by traversing downstream from the first object; provide the stability proxies to a well management module to optimize production; validate boundary conditions based on the stability proxies associated with a boundary object of the plurality of objects; perform a look-up to set the initial values for the boundary object; determine initial values for each of the plurality of objects upstream of the boundary object; determine initial values for each object of the plurality of objects from the boundary object by traversing upstream from each connected object to the subsequent object until a base object is reached; modify one of the plurality of objects; and based on the modified one of the plurality of objects, adjust the stability proxies downstream of the modified one of the plurality of objects and continuing to use the stability proxies for each of the plurality of objects upstream of the modified one of the plurality of objects.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other. As such, it will be apparent, however, to one skilled in the art, that many modifications and variations to the embodiments described herein are possible. All such modifications and variations are intended to be within the scope of the present invention, as defined by the appended claims.

The invention claimed is:

1. A method for creating and using stability proxies for hydrocarbon operations in a subsurface region comprising:
obtaining a simulation model associated with a portion of a reservoir, a portion of one or more wells, and a portion of a production facility network,
wherein the simulation model includes a plurality of objects,
wherein each of the plurality of objects represents a portion of the reservoir, a portion of the one or more wells, or a portion of the production facility network, and the plurality of objects include one or more of a node object, a connection object and any combination thereof;
creating a stability proxy for each of the plurality of objects to form stability proxies;
determining initialization parameters based on the created stability proxies;
performing a reservoir simulation based on the initialization parameters; and
outputting the simulation results, wherein the simulation results comprise one or more of pressure, injection flow rate, production flow rate and any combination thereof;
wherein the method further comprises modifying one of the plurality of objects; and based on the modified one of the plurality of objects, adjusting the stability proxies downstream of the modified one of the plurality of objects and continuing to use the stability proxies for each of the plurality of objects upstream of the modified one of the plurality of objects.

2. The method of claim 1, wherein each stability proxy comprise a set of equations.

3. The method of claim 1, wherein the stability proxy is a discrete dataset and is constructed separately for each of the plurality of objects.

4. The method of claim 3, further comprising determining whether each of the stability proxies provides sufficient resolution; and adding data to the table when the resolution is not sufficient.

5. The method of claim 1, wherein the stability proxy is a one-dimensional (1D) table with one or more columns associated with values for fluid flow within the respective objects.

6. The method of claim 5, wherein the one or more columns comprise one or more of pressure, mass rate of flow, and phase rate of flow.

7. The method of claim 5, wherein the one or more columns comprise a range of values from a minimum value to a maximum value.

8. The method of claim 1, wherein creating the stability proxy comprises calculating only first order derivatives.

9. The method of claim 1, wherein creating the stability proxy for each of the plurality of objects further comprises creating a first stability proxy for a first object closest to the reservoir and then creating additional stability proxies for each of the plurality of objects by traversing downstream from the first object.

10. The method of claim 1, further comprising providing the stability proxies to a well management module to optimize production.

11. The method of claim 1, further comprising validating boundary conditions based on the stability proxies associated with a boundary object of the plurality of objects.

12. The method of claim 11, further comprising performing a look-up to set the initial parameter for the boundary object.

13. The method of claim 12, further comprising determining initial parameters for each of the plurality of objects upstream of the boundary object.

14. The method of claim 12, further comprising determining initial parameters for each object of the plurality of objects from the boundary object by traversing upstream from each connected object to the subsequent object until a base object is reached.

15. A system for creating and using stability proxies for hydrocarbon operations in a subsurface region comprising:
a processor;
an input device in communication with the processor and is configured to receive input data associated with a subsurface region; and
memory in communication with the processor and having a set of instructions, wherein the set of instructions, when executed by the processor, are configured to:
obtain a simulation model associated with a portion of a reservoir, a portion of one or more wells, and a portion of a production facility network, the simulation model includes a plurality of objects, wherein each of the plurality of objects represents a portion of the reservoir, a portion of the one or more wells, or a portion of the production facility network, and the plurality of objects include one or more of a node object, a connection object and any combination thereof;
create a stability proxy for each of the plurality of objects to form stability proxies;
determine initialization parameters based on the created stability proxies;
perform a reservoir simulation based on the initialization parameters; and
output the simulation results, wherein the simulation results comprise one or more of pressure, injection flow rate, production flow rate and any combination thereof;
wherein the set of instructions, when executed by the processor, are further configured to:
modify one of the plurality of objects; and based on the modified one of the plurality of objects, adjust the stability proxies downstream of the modified one of the plurality of objects and continuing to use the stability proxies for each of the plurality of objects upstream of the modified one of the plurality of objects.

16. The system of claim 15, wherein each of the stability proxies comprise a set of equations.

17. The system of claim 15, wherein the stability proxy is a discrete dataset and is constructed separately for each of the plurality of objects.

18. The system of claim 17, wherein the set of instructions, when executed by the processor, are further configured to: determine whether each of the stability proxies provides sufficient resolution; and add data to the table when the resolution is not sufficient.

19. The system of claim 15, wherein the stability proxy is a one-dimensional (1D) table with one or more columns associated with values for fluid flow within the respective objects.

20. The system of claim 19, wherein the one or more columns comprise one or more of pressure, mass rate of flow, and phase rate of flow.

21. The system of claim 19, wherein the one or more columns comprise a range of values from a minimum value to a maximum value.

22. The system of claim 15, wherein the set of instructions, when executed by the processor, are further configured to calculate only first order derivatives to create the each stability proxy.

23. The system of claim 15, wherein the set of instructions, when executed by the processor, are further configured to create a first stability proxy for a first object closest to the reservoir and then create additional stability proxies for each of the plurality of objects by traversing downstream from the first object.

24. The system of claim 15, wherein the set of instructions, when executed by the processor, are further configured to provide the stability proxies to a well management module to optimize production.

25. The system of claim 15, wherein the set of instructions, when executed by the processor, are further configured to validate boundary conditions based on the stability proxies associated with a boundary object of the plurality of objects.

26. The system of claim 25, wherein the set of instructions, when executed by the processor, are further configured to perform a look-up to set the initial parameter for the boundary object.

27. The system of claim 25, wherein the set of instructions, when executed by the processor, are further configured to determine initial parameters for each of the plurality of objects upstream of the boundary object.

28. The system of claim 26, wherein the set of instructions, when executed by the processor, are further configured to determine initial parameters for each object of the plurality of objects from the boundary object by traversing upstream from each connected object to the subsequent object until a base object is reached.

* * * * *